| United States Patent [19] | [11] Patent Number: 4,595,644 |
| Saitoh et al. | [45] Date of Patent: Jun. 17, 1986 |

[54] PHOTOCONDUCTIVE MEMBER OF A-SI(GE) WITH NONUNIFORMLY DISTRIBUTED NITROGEN

[75] Inventors: Keishi Saitoh, Ibaraki; Yukihiko Ohnuki, Kawasaki; Shigeru Ohno, Yokohama, all of Japan

[73] Assignee: Canon Kabushiki Kaisha, Tokyo, Japan

[21] Appl. No.: 648,245

[22] Filed: Sep. 7, 1984

[30] Foreign Application Priority Data

| Sep. 12, 1983 | [JP] | Japan | 58-168546 |
| Sep. 13, 1983 | [JP] | Japan | 58-170382 |
| Dec. 27, 1983 | [JP] | Japan | 58-244737 |
| Dec. 27, 1983 | [JP] | Japan | 58-244741 |
| Dec. 28, 1983 | [JP] | Japan | 58-245304 |
| Dec. 28, 1983 | [JP] | Japan | 58-245316 |

[51] Int. Cl.[4] .................................... G03G 5/082
[52] U.S. Cl. ........................ 430/57; 430/60; 430/69; 430/84; 430/95
[58] Field of Search ............... 430/57, 60, 69, 84, 430/95

[56] References Cited

U.S. PATENT DOCUMENTS

| 4,451,546 | 5/1984 | Kawamura et al. | 430/57 |
| 4,490,450 | 12/1984 | Shimizu et al. | 430/57 |
| 4,491,626 | 1/1985 | Kawamura et al. | 430/57 |

*Primary Examiner*—John L. Goodrow
*Attorney, Agent, or Firm*—Fitzpatrick, Cella, Harper & Scinto

[57] ABSTRACT

A photoconductive member comprises a substrate and a layer constituted of an amorphous material containing Si and Ge and exhibiting photoconductivity, said layer having a layer region containing nitrogen ununiformly in the direction of layer thickness, the distribution concentration curve of nitrogen in the direction of layer thickness being smooth and the maximum distribution concentration being present in said layer.

An amorphous layer of Si containing at least one of oxygen and carbon may overlie the above mentioned layer.

96 Claims, 22 Drawing Figures

PHOTOCONDUCTIVE MEMBER OF A-SI(GE) WITH NONUNIFORMLY DISTRIBUTED NITROGEN

BACKGOURND OF THE INVENTION

1. Field of the Invention

This invention relates to a photoconductive member having sensitivity to electromagnetic waves such as light [herein used in a broad sense, including ultraviolet rays, visible light, infrared rays, X-rays, gamma-rays, and the like].

2. Description of the Prior Art

Photoconductive materials, which constitute photoconductive layers in solid stage image pickup devices, image forming members for electrophotography in the field of image formation, or manuscript reading devices and the like, are required to have a high sensitivity, a high SN ratio [photocurrent $(I_p)$/dark current $(I_d)$], spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. Particularly, in case of an image forming member for electrophotography to be assembled in an electrophotographic device to be used in an office as office apparatus, the aforesaid harmless characteristic is very important.

From the standpoint as mentioned above, amorphous silicon [hereinafter referred to as a-Si] has recently attracted attention as a photoconductive material. For example, German OLS Nos. 2746967 and 2855718 disclose applications of a-Si for use in image forming members for electrophotography, and German OLS No. 2933411 discloses an application of a-Si for use in a photoelectric transducing reading device.

However, under the present situation, the photoconductive members of the prior art having photoconductive layers constituted of a-Si are further required to be improved in a balance of overall characteristics including electrical, optical and photoconductive characteristics such as dark resistance value, photosensitivity and response to light, etc., and environmental characteristics during use such as humidity resistance, and further stability with the lapse of time.

For instance, when the above photoconductive member is applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed.

Further, a-Si has a relatively smaller coefficient of absorption of the light on the longer wavelength side in the visible light region as compared with that on the shorter wavelength side. Accordingly, in matching to the semiconductor laser practically applied at the present time, the light on the longer wavelength side cannot effectively be utilized, when employing a halogen lamp or a fluorescent lamp as the light source. Thus, various points remain to be improved.

On the other hand, when the light irradiated is not sufficiently absorbed in the photoconductive layer, but the amount of the light reaching the substrate is increased, interference due to multiple reflection may occur in the photoconductive layer to become a cause for "unfocused" image, in the case when the substrate itself has a high reflectance against the light transmitted through the photoconductive layer.

This effect will be increased, if the irradiated spot is made smaller for the purpose of enhancing resolution, thus posing a great problem in the case of using a semiconductor laser as the light source.

Further, a-Si materials to be used for constituting the photoconductive layer may contain as constituent atoms hydrogen atoms or halogen atoms such as fluorine atoms, chlorine atoms, etc. for improving their electrical, photoconductive characteristics, boron atoms, phosphorous atoms, etc. for controlling the electroconduction type as well as other atoms for improving other characteristics. Depending on the manner in which these constituent atoms are contained, there may sometimes be caused problems with respect to electrical or photoconductive characteristics of the layer formed.

That is, for example, in many cases, the life of the photocarriers generated by light irradiation in the photoconductive layer formed is insufficient, or at the dark portion, the charges injected from the substrate side cannot be sufficiently impeded.

Accordingly, while attempting to improve the characteristics of a-Si material per se on one hand, it is also required to make efforts to overcome all the problems as mentioned above in designing of the photoconductive member on the other hand.

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. It has now been found that a photoconductive member having a layer constitution comprising a light receiving layer exhibiting photoconductivity, which comprises a-Si, especially an amorphous material containing at least one of hydrogen atom (H) and halogen atom (X) in a matrix of silicon atoms (Si) and germanium (Ge) such as so called hydrogenated amorphous silicon-germanium, halogenated amorphous silicon-germanium or halogen-containing hydrogenated amorphous silicon-germanium [hereinafter referred to comprehensively as a-SiGe(H,X)], said photoconductive member being prepared by designing so as to have a specific structure as hereinafter described, not only exhibits practically extremely excellent characteristics but also surpass the photoconductive members of the prior art in substantially all respects, especially having markedly excellent characteristics as a photoconductive member for electrophotography and also excellent absorption spectrum characteristics on the longer wavelength side.

SUMMARY OF THE INVENTION

A primary object of the present invention is to provide a photoconductive member having electrical, optical and photoconductive characteristics which are constantly stable and all-environment type with virtually no dependence on the environments under use, which member is markedly excellent in photosensitive characteristic on the longer wavelength side and light fatigue resistance, and also excellent in durability without causing deterioration phenomenon when used repeatedly, exhibiting no or substantially no residual potential observed.

Another object of the present invention is to provide a photoconductive member which is high in photosensitivity throughout the whole visible light region, particularly excellent in matching to a semiconductor laser and also rapid in response to light.

Still another object of the present invention is to provide a photoconductive member which exhibits excellent close contact between a support and a layer overlying the support and that between the laminated layers, is elaborate and stable with respect to structural arrangement and has a high layer quality.

A still further object of the present invention is to provide an excellent photoconductive member which has a sufficient charge retentivity upon charging treatment for formation of electrostatic images to such an extent that a conventional electrophotographic method can be very effectively applied when it is used as an image forming member for electrophotography and further has excellent electrophotographic characteristics which are little lowered even under high humidity.

Still another object of the present invention is to provide a photoconductive member for electrophotography capable of easily producing images of high quality having high density, clear halftone and high resolution.

A still further object of the present invention is to provide a photoconductive member having high photosensitivity, high SN ratio characteristics, and good electrical contact with the support.

According to one aspect of the present invention, there is provided a photoconductive member which comprises a substrate for a photoconductive member and a light receiving layer constituted of an amorphous material containing silicon atoms and germanium atoms and exhibiting photoconductivity, the light receiving layer having a layer region (N) containing nitrogen atoms ununiformly in the direction of layer thickness, the distribution concentration curve of nitrogen atoms in the direction of layer thickness being smooth, and the maximum distribution concentration being present within the light receiving layer.

According to another aspect of the present invention, there is provided a photoconductive member which comprises a substrate for a photoconductive member and a light receiving layer constituted of a first layer (I) overlying the substrate and comprising an amorphous material containing silicon atoms and germanium atoms and a second layer (II) overlying the first layer (I) and comprising an amorphous material containing silicon atoms and at least one of carbon atoms and oxygen atoms, nitrogen atoms being contained in the first layer (I), the concentration distribution curve of the nitrogen atoms in the direction of layer thickness being smooth, and the maximum distribution concentration being present within the first layer (I).

According to a further aspect of the present invention, there is provided a photoconductive member which comprises a substrate for a photoconductive member and a light receiving layer constituted of a first layer region (G) comprising an amorphous material containing germanium atoms and a second layer region (S) comprising an amorphous material containing silicon atoms and exhibiting photoconductivity, the first layer region (G) and the second layer region (S) being provided in the mentioned order on the substrate, the light receiving layer containing nitrogen atoms and the concentration distribution curve of nitrogen atom being smooth and the maximum distribution concentration being present within the light receiving layer.

According to still further aspect of the present invention, there is provided a photoconductive member which comprises a substrate for a photoconductive member, a light receiving layer constituted of a first layer (I) having a first layer region (G) overlying the substrate and comprising an amorphous material containing germanium atoms and a second layer region (S) overlying the first layer region (G), comprising an amorphous material containing silicon atoms and exhibiting photoconductivity, and a second layer (II) overlying the first layer (I) and comprising an amorphous material containing silicon atoms and at least one of carbon atoms and oxygen atoms, the first layer (I) containing nitrogen atoms, the concentration distribution curve of nitrogen atom being smooth, and the maximum distribution concentration of nitrogen atom being present within the first layer.

DETAILED DESCRIPTION OF THE PREFERRED EMBODIMENTS

Referring now to the drawigns, the photoconductive members according to the present invention are to be described in detail below.

Figure 1:
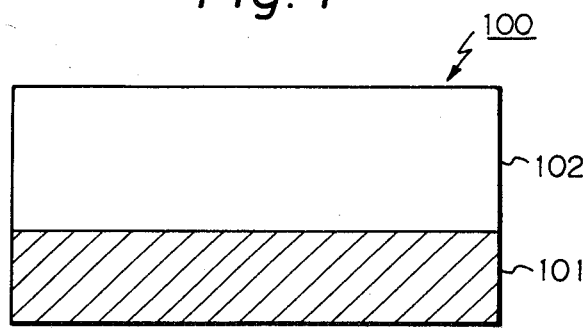
FIG. 1 shows a schematic sectional view for illustration of the layer constitution of a preferred embodiment of the photoconductive member according to the present invention.

FIG. 1 shows a schematic sectional view for illustration of the layer constitution of the photoconductive member of a first preferable embodiment of this invention.

The photoconductive member 100 as shown in FIG. 1 is constituted of a-SiGe(H,X) formed on a substrate 101 for photoconductive member, of nitrogen atoms and light receiving layer 102 having photoconductivity.

The germanium atoms existing in the light receiving layer 102 may be uniformly distributed throughout the layer 102 or may be distributed throughout in the layer thickness direction but not uniformly in the content of germanium atoms in depth profile. In any case, however, it is necessary that the germanium atoms are distributed uniformly and contained without exception in the interplanar direction, i.e. the direction in parallel to the substrate surface, to make the characteristics uniform in the interplanar direction.

The germanium atoms are particularly contained in the light receiving layer 102 in such a manner that they are contained without exception throughout the layer thickness direction of the light receiving layer 102 and are more distributed in the substrate 101 side (i.e., the side of interface between the light receiving layer 102 and the substrate 101) than the side opposite to the substrate 101-provided side (that is, the surface 104 side of light receiving layer 102), or they take quite a reversed depth profile.

In the photoconductive member shown in FIG. 1, it is desirable that the germanium atoms existing in said light receiving layer 102 can take said depth profile in the layer thickness direction and a uniform distribution state in the interplanar direction in parallel to the substrate 101 surface.

FIGS. 2 through 10 each show typical examples of nonuniform depth profile in the layer thickness direction of germanium atoms in the light receiving layer 102 of the photoconductive member in the present invention.

In FIGS. 2 through 10, the abscissa indicates the content C of germanium atoms and the ordinate the layer thickness of the photoconductive light receiving layer 102, $t_B$ showing the position of the surface of the light receiving layer 102 on the substrate 101 side and $t_T$ the position of the surface of the light receiving layer 102 on the side opposite to the substrate 101 side. That is, layer formation of the light receiving layer 102 containing germanium atoms proceeds from the $t_B$ side toward the $t_T$ side.

Figure 2:
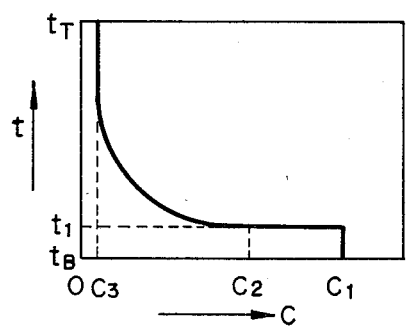
FIGS. 2 to 10 each shows an illustration for explanation of the depth profiles of germanium atoms in the light receiving layer.

In FIG. 2, there is shown a first typical embodiment of the depth profile of germanium atoms in the layer thickness direction in the light receiving layer 102.

In the embodiment as shown in FIG. 2, from the interface position $t_B$ at which the surface, on which the light receiving layer 102 containing germanium atoms is to be formed, is in contact with the surface of said light receiving layer 102 to the position $t_1$, germanium atoms exist in the formed light receiving layer 102, while keeping the content C of germanium atoms at a constant value of $C_1$, and the content gradually decreases from the content $C_2$ continuously from the position $t_1$ to the interface position $t_T$. At the interface position $t_T$, the content C of germanium atoms reaches $C_3$.

Figure 3:
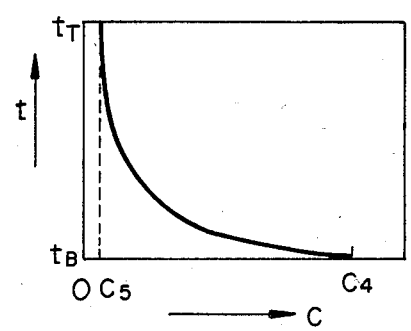

In an embodiment shown in FIG. 3, the content C of germanium atoms decreases gradually and continuously from the position $t_B$ to the position $t_T$ from the content $C_4$ until it reaches the content $C_5$ at the position $t_T$.

Figure 4:
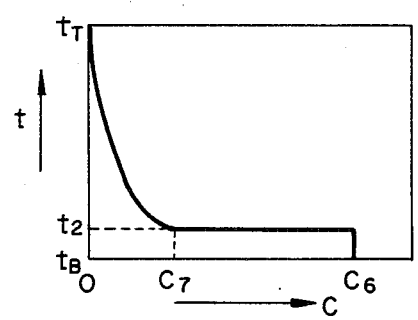

In case of FIG. 4, the content C of germanium atoms is kept at constant $C_6$ from the position $t_B$ to the position $t_2$, gradually decreases continuously from the position $t_2$ to the position $t_T$, and the content C is substantially zero at the position $t_T$ (substantially zero herein means the content below the detectable limit).

Figure 5:
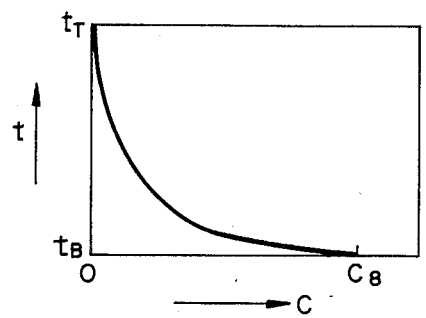

In case of FIG. 5, the content C of germanium atoms decreases gradually and continuously from the position $t_B$ to the position $t_T$ from the content $C_8$, until it reaches substantially zero at the position $t_T$.

Figure 6:
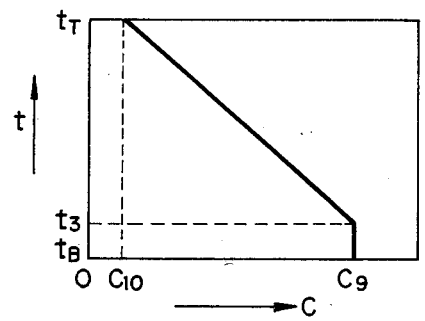

In an embodiment shown in FIG. 6, the content C of germanium atoms is kept at constant $C_9$ between the position $t_B$ and the position $t_3$, and it reaches $C_{10}$ at the position $t_T$. Between the position $t_3$ and the position $t_T$, the content decreases linearly from the position $t_3$ to the position $t_T$.

Figure 7:
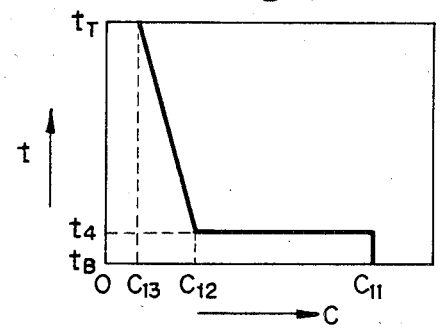

In an embodiment shown in FIG. 7, there is formed a depth profile such that the content C takes a constant $C_{11}$ from the position $t_B$ to the position $t_4$, and decreases as a first order function from the content $C_{12}$ to the content $C_{13}$ from the position $t_4$ to the position $t_T$.

Figure 8:
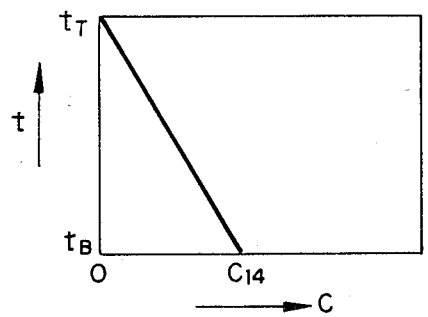

In an embodiment shown in FIG. 8, the content C of germanium atoms decreases linearly from the content $C_{14}$ to substantially zero from the position $t_B$ to the position $t_T$.

Figure 9:
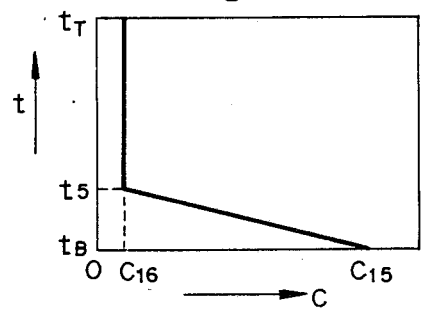

In FIG. 9, there is shown an embodiment, where the content C of germanium atoms decreases linearly from the content $C_{15}$ to $C_{16}$ from the position $t_B$ to $t_5$ and is kept at constant content $C_{16}$ between the position $t_5$ and $t_T$.

Figure 10:
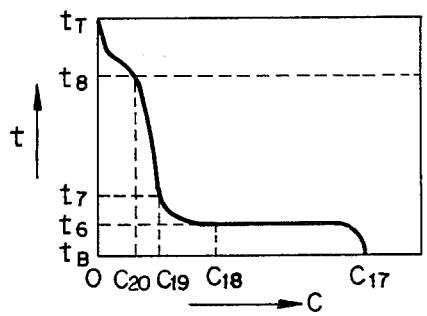

In an embodiment shown in FIG. 10, the content C of germanium atoms is kept at the content $C_{17}$ at the position $t_B$, whose content $C_{17}$ initially decreases gradually and abruptly near the position $t_6$, until it reaches the content $C_{18}$ at the position $t_6$.

Between the position $t_6$ and the position $t_7$, the content C initially decreases abruptly and thereafter gradually, until it reaches the content $C_{19}$ at the position $t_7$. Between the position $t_7$ and the position $t_8$, the content decreases very gradually to the content $C_{20}$ at the position $t_8$. Between the position $t_8$ and the position $t_T$, the content decreases along the curve having a shape as shown in the Figure from the content $C_{20}$ to substantially zero.

As described above about some typical examples of depth profiles of germanium atoms in the light receiving layer 102 in the layer thickness direction by referring to FIGS. 2 through 10, in the preferred embodiment of the present invention, the light receiving layer has a depth profile so as to have a portion rich in content C of germanium atoms on the substrate side and a position considerably poor in content C of germanium atoms on the interface $t_T$ side as compared with the substrate side.

The light receiving layer 102 for the photoconductive member 100 in the present invention desirably has a localized region (A) containing germanium atoms preferably in a relatively higher content on the substrate 101 side or on the free surface side to the contrary as described above.

For example, the localized region (A), as explained in terms of the symbols shown in FIG. 2 through FIG. 10, may be desirably provided within the depth of $5\mu$ from the interface position $t_B$.

Said localized region (A) may be made to be identical with the whole layer region($L_T$) up to the depth of $5\mu$ from the interface position $t_B$, or alternatively a part of the layer region ($L_T$).

Whether the localized region (A) is made a part or whole of the layer region ($L_T$) depends on the characteristics required for the light receiving layer 102 to be formed.

The localized region (A) may preferably be formed according to such a layer formation that the maximum value Cmax of the content of germanium atoms existing in the layer thickness direction may preferably be 1000 atomic ppm or more, more preferably 5000 atomic ppm or more, and most preferably $1 \times 10^4$ atomic ppm or more on basis of sum total with silicon atoms.

That is, according to the present invention, the light receiving layer 102 containing germanium atoms is formed so that the maximum value Cmax of the content may exist within a layer thickness of $5\mu$ from the substrate 101 side (the layer region within the depth of 5μ from $t_B$).

In the present invention, the content of germanium atoms in the light receiving layer 102 may be selected as desired so as to effectively achieve the objects of the present invention, and is preferably 1 to $9.5 \times 10^5$ atomic ppm, more preferably 100 to $8 \times 10^5$ atomic ppm, and most preferably 500 to $7 \times 10^5$ atomic ppm, on the basis of sum total with silicon atoms. In the light receiving layer 102 with desired characteristics can be formed as desired by designing the change rate curve of content C of germanium atoms as desired, when the germanium atoms are continuously distributed in the whole layer region and the content C of germanium atoms distributed in the layer thickness direction is made lower toward the free surface side of the light receiving layer 102 or made higher toward the substrate 101 side, or given an increasing change in the depth profile of germanium atoms in the light receiving layer 102.

For example, when the content curve of germanium atoms in depth profile is changed so that the content C of germanium atoms in the light receiving layer 102 is made as high as possible on the substrate 101 side and is made as much as possible on the free surface side of the light receiving layer 102, a higher photosensitization can be obtained in the whole region of wavelength ranging from the relatively short wavelength to the relatively long wavelength, including the visible light region and also an interference of interferable light such as laser beam, can be effectively prevented.

When a semi-conductor laser is used, the long-wavelength light cannot be thoroughly absorbed on the laser-irradiated surface side of the light receiving layer 102, but by increasing the content C of germanium atoms to an extreme at the end part on the substrate 101 side of the light receiving layer 102, such long-wavelength light can be substantially completely absorbed in the layer region at the end part on the substrate side of the light receiving layer 102, and the interference by reflection from the substrate surface can be effectively prevented, as will be described later.

In the photoconductive member 100 of the present invention, nitrogen atoms are contained in the light receiving layer 102 to attain a higher photosensitization and a higher dark resistance, and to prevent the charge injection from the free surface of the light receiving layer 102. Nitrogen atoms in the light receiving layer 102 may be distributed uniformly throughout the layer region of the light receiving layer 102 or distributed locally only in a part of the layer region of the light receiving layer 102.

In the layer region (N) containing nitrogen atoms, the content C(N) of nitrogen atoms is uniform in the interplaner direction parallel to the surface of the substrate 101 of the light receiving layer 102 and is ununiform in the layer thickness direction.

In the present invention, for the purpose of accomplishing more effectively the object of the present invention, nitrogen atoms should desirably be contained in the layer region (N) in such a way that the depth profile of nitrogen atoms in the layer thickness direction in the layer region (N) is smooth and continuous in the whole region. Also, by designing of the aforesaid depth profile so that the maximum content Cmax may exist within the inner portion of the light receiving layer 102, the effect as hereinafter described will markedly be exhibited.

In the present invention, the above maximum content Cmax should desirably be provided in the vicinity of the surface opposite to the substrate 101 of the light receiving layer 102 (the free surface side in FIG. 1). In this case, by selecting appropriately the maximum content Cmax, it is possible to effectively inhibit injection of charge from the surface into the inner portion of the light receiving layer 102, when the light receiving layer 102 is subjected to charging treatment from the free surface side.

Also, in the vicinity of the aforesaid free surface, durability in a highly humid atmosphere can further be enhanced by incorporation of nitrogen atoms into the light receiving layer 102 in a distribution state such that nitrogen atoms are abruptly decreased in content C(N) from the maximum content of Cmax toward the free surface.

In the present invention, when the depth profile of nitrogen atoms has the maximum content Cmax in the inner portion of the light receiving layer 102, by further designing the depth profile of nitrogen atoms contained so that the maximum value of the content may exist on the side nearer to the substrate 101 side, adhesion between the substrate 101 and the light receiving layer 102 and inhibition of charge injection can be improved.

In the present invention, it is desirable that nitrogen atoms should be contained in the central layer region of the light receiving layer 102 in an amount within the range which does not lower photosensitivity and increase dark resistance.

In the present invention, the maximum content Cmax may preferably be 67 atomic % or less, more preferably 50 atomic % or less, most preferably 40 atomic % or less based on the sum of silicon atoms, germanium atoms and nitrogen atoms (hereinafter written as T(Si-GeN)).

FIG. 11 through FIG. 14 each show a typical example of depth profile of nitrogen atoms throughout the light receiving layer 102, where symbols used for the illustration have the same meanings as used for FIG. 2 through FIG. 10, unless otherwise mentioned.

Figure 11:
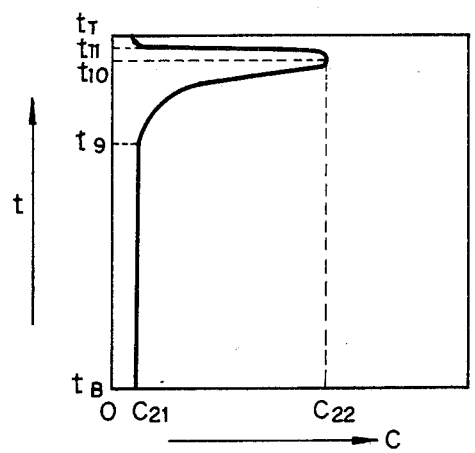
FIGS. 11 to 14 each shows an illustration for explanation of the depth profiles of nitrogen atoms in the light receiving layer.

In the embodiment shown in FIG. 11, the content C(N) of nitrogen atom in depth profile is made $C_{21}$ from the position $t_B$ to the position $t_9$, increased from the position $t_9$ to the position $t_{10}$ until it reaches a peak value of $C_{22}$ at the position $t_{10}$. From the position $t_{10}$ to the position $t_{11}$, the content C(N) of nitrogen atom in depth profile is decreased, until it becomes $C_{21}$ at the position $t_T$.

Figure 12:
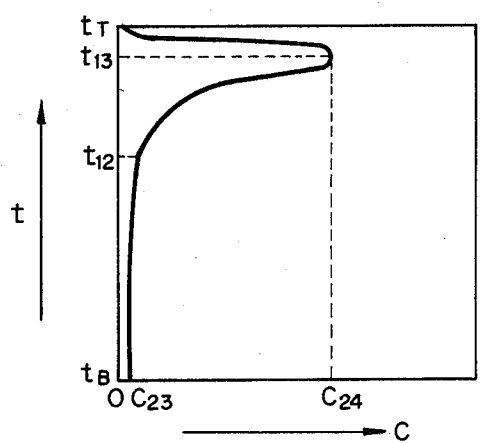

In the embodiment shown in FIG. 12, the content C(N) of nitrogen atom in depth profile is made $C_{23}$ from the position $t_B$ to the position $t_{12}$, while it is abruptly increased from the position $t_{12}$ to the position $t_{13}$, whereat the content C(N) of nitrogen atom in depth profile takes a peak value of $C_{24}$, and thereafter decreased substantially to zero from the position $t_{13}$ to the position $t_T$.

Figure 13:
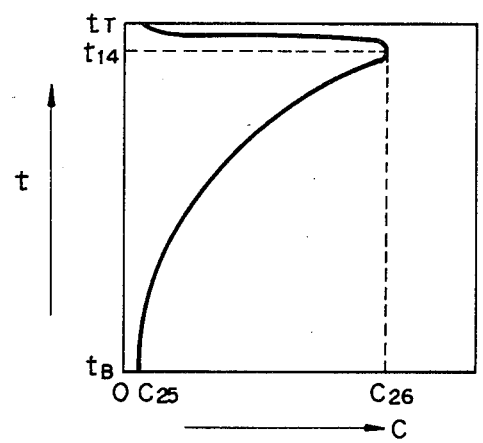

In the embodiment shown in FIG. 13, the content C(N) of nitrogen atom in depth profile is gently increased from $C_{25}$ to $C_{26}$ between the positions $t_B$ and $t_{14}$, until it reaches a peak value of $C_{26}$ at the position $t_{14}$. From the position $t_{14}$ to the position $t_T$, the content C(N) of nitrogen atom in depth profile is abruptly decreased to become $C_{25}$ at the position $t_T$.

Figure 14:
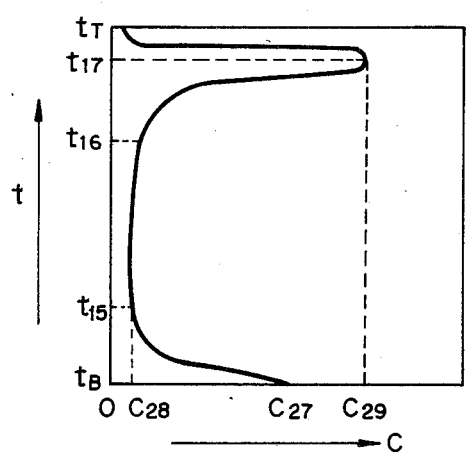

In the embodiment shown in FIG. 14, the content C(N) of nitrogen atom in depth profile is $C_{27}$ at the position $t_B$, which is then decreased to the position $t_{15}$, and the content is constantly $C_{28}$ from the position $t_{15}$ to the position $t_{16}$. From the position $t_{16}$ to the position $t_{17}$, the content C(N) of nitrogen atom in depth profile is increased to take a peak value of $C_{29}$ at the position $t_{17}$. From the position $t_{17}$ to the position $t_T$, the content C(N) of nitrogen atom in depth profile is decreased to become $C_{28}$ at the position $t_T$.

In the present invention, the layer region (N) containing nitrogen atoms in the light receiving layer 102 is provided so as to occupy the whole layer region of the light receiving layer 102 when it is intended to improve primarily photosensitivity and dark resistance. It is provided in the vicinity of the free surface when it is intended to prevent the charge injection from the free surface of the light receiving layer 102. In order to strengthen adhesion between the substrate 101 and the light receiving layer 102, it is provided so as to occupy the end portion layer region on the substrate 101 side of the light receiving layer 102.

In the first case, the content of nitrogen atoms to be contained in the layer region (N) is made relatively smaller in order to maintain high photosensitivity. In the second case, it is made relatively larger in order to prevent the charge injection from the free surface of the light receiving layer 102. In the third case, it should desirably be made relatively larger in order to ensure strengthening of adhesion with the substrate 101.

For the purpose of accomplishing simultaneously the objects of the three cases, nitrogen atoms may be distributed at relatively higher content on the substrate 101 side and at relatively lower content in the middle of the light receiving layer 102, and there may be formed a distribution of nitrogen atoms in the layer region (N) such that a lot of nitrogen atoms are positively contained in the surface layer region on the free surface side of the light receiving layer.

The content of nitrogen atoms in the free surface side is made larger in order to prevent the charge injection from the free surface.

In the present invention, the content of nitrogen atoms to be contained in the layer region (N) provided in the light receiving layer 102 may be suitably selected depending on the characteristics required for the layer region (N) per se or, when said layer region (N) is provided in direct contact with the substrate, depending on the organic relationship such as the relation with the characteristics at the contacted interface with said substrate and others.

When another layer region is to be provided in direct contact with said layer region (N), the content of nitrogen atoms may be suitably selected also with considerations about the characteristics of said another layer region and the relation with the characteristics of the contacted interface with said another layer region.

The content of nitrogen atoms in the layer region (N), which may suitably be determined as desired depending on the characteristics required for the photoconductive member to be formed, may be preferably 0.001 to 50 atomic %, more preferably 0.002 to 40 atomic %, most preferably 0.003 to 30 atomic % based on T(SiGeN).

In the present invention, when the layer region (N) occupies the whole region of the light receiving layer 102 or when, although it does not occupy the whole region of the light receiving layer 102, the layer thickness To of the layer region (N) is sufficiently large relative to the layer thickness T of the light receiving layer 102, the upper limit of the content of nitrogen atoms in the layer region (N) should desirably be sufficiently smaller than the aforesaid value.

When the ratio of the layer thickness To of the layer region (N) relative to the layer thickness T of the light receiving layer 102 is 2/5 or higher, the upper limit of the content of nitrogen atoms in the layer region (N) may preferably be 30 atomic % or less, more preferably 20 atomic % or less, most preferably 10 atomic % or less based on T(SiGeN).

In the present invention, the layer region (N) containing nitrogen atoms as a constituent of the light receiving layer 102 desirably has a localized region (B) containing the nitrogen atoms with a relative high content on the substrate 101 side and/or the free surface side, as described above, where the adhesion between the substrate 101 and the light receiving layer 102 can be more improved and the acceptable potential can be increased.

The localized region (B), as explained in terms of the symbols used in FIG. 11 through FIG. 14, may be desirably provided within the depth of $5\mu$ from the interface position $t_B$ or the free surface $t_T$.

In the present invention, said localized region (B) can occupy the whole layer region ($L_T$) down to the depth of $5\mu$ from the interface position $t_B$ from the free surface $t_T$, or can occupy a portion of the layer region ($L_T$).

Whether the localized region occupies a portion or a whole of the layer region ($L_T$) depends on the characteristics required for the light receiving layer to be formed.

The localized region (B) is desirably formed so that the maximum value Cmax of the content C(N) of nitrogen atoms existing in depth profile in the layer thickness direction in the localized region (B) can be preferably 500 atomic ppm or more, more preferably 800 atomic ppm or more, and most preferably 1,000 ppm or more.

That is, in the present invention, the layer region (N) containing the nitrogen atoms is desirably formed so that the maximum value Cmax of the content in depth profile can reside within the depth of $5\mu$ from the substrate 101 side or from the free surface (the layer region $5\mu$ thick from $t_B$ or $t_T$).

In the present invention, the halogen atoms (X), which can be contained, if necessary, in the light receiving layer 102, may include, for example, fluorine, chlorine, bromine, and iodine, among which fluorine and chlorine are particularly preferable.

In the photoconductive member 100 of the present invention, the conductive characteristics of the light receiving layer 102 can be controlled as desired by adding a substance (C) capable of controlling the conductive characteristics to the light receiving layer 102.

Such substance (C) may include the so called impurities in the semi-conductor field. In the present invention, p-type impurities capable of imparting p-type conductive characteristics to a-SiGe(H,X) as a constituent for the light receiving layer 102, and n-type impurities capable of imparting n-type conductive characteristics thereto can be examplied as the substance (C). More particularly, the p-type impurities may include atoms belonging to group III of the periodic table (group III atoms), such as B (boron), Al (aluminum), Ga (gallium), In (indium), Tl (thallium), etc., among which B and Ga are particularly preferably used.

The n-type impurities may include atoms belonging to group V of the periodic table (group V atoms), such as P (phosphorus), As (arsenic), Sb (antimony), Bi (bismuth), etc., among which P and As are particularly preferably used.

In the present invention, the content of the substance (C) existing in the light receiving layer 102 to control the conductive characteristics can be selected as desired in view of the conductive characteristics required for the light receiving layer 102, or in view of organic relationship such as relationship to characteristics at the contact interface with the substrate 101 on which the light receiving layer 102 is provided in direct contact therewith.

Furthermore, the content of the substance (C) existing in the light receiving layer 102 to control the conductive characteristics can be selected as desired in view of relationships to the characteristics of other layer region to be provided in direct contact with said layer region or in view of relationships to the characteristics at the contact interface with said other layer region, when the substance (C) is made to locally exist in the desired layer region of the light receiving layer 102, particularly when the substance (C) is made to exist in the layer region at the end part on the substrate 101 side of the light receiving layer 102.

In the present invention, it is desirable that the content of the substance (C) existing in the light receiving layer 102 to control the conductive characteristics is preferably 0.01 to $5 \times 10^4$ atomic ppm, more preferably 0.5 to $1 \times 10^4$ atomic ppm, and most preferably 1 to $5 \times 10^3$ atomic ppm.

In the present invention, when the content of the substance (C) existing in the layer region (PN) is preferably 30 atomic ppm or more, more preferably 50 atomic ppm or more, and most preferably 100 atomic ppm or more, it is desirable that said substance (C) exists locally in a layer region of the light receiving layer 102, particularly in the layer region (E) at the end portion on the substrate 101 side of the light receiving layer 102.

By the inclusion of the substance (C) capable of controlling the conductive characteristics in the layer region (E) at the end part on the substrate 101 side of the light receiving layer 102 in said content or more, the injection of electrons into the light receiving layer 102 from the substrate 101 side can be effectively prevented when the free surface of the light receiving layer 102 is subjected to the charging treatment to positive polarity in the case that the substance (C) is said p-type impurity. On the other hand, in the case that the substance (C) is said n-type impurity, injection of positive holes into the light receiving layer 102 from the substrate 101 side can be effectively prevented, when the free surface of the light receiving layer 102 is subjected to the charging treatment to negative polarity.

When a substance, capable of controlling the conductive characteristics in one polarity exists in the layer region (E) at the end part in this manner, the remaining layer region of the light receiving layer 102, that is, the layer region (Z), which is the part exclusive of the layer region (E) at the end part, can contain a substance capable of controlling the conductive characteristics in other polarity, or can contain a substance capable of controlling the conductive characteristics in the same polarity, in much less content than in the actual content of the layer region (E) at the end part.

In that case, the content of the substance existing in the layer region (Z) to control the conductive characteristics can be selected as desired in view of the polarity or the content of the substance existing in the layer region (E) at the end part, and is preferably 0.001 to 1000 atomic ppm, more preferably 0.05 to 500 atomic ppm, and most preferably 0.1 to 200 atomic ppm.

In the present invention, when a substance capable of controlling the conductive characteristics in same polarity exists in the layer region (E) at the end part and in the layer region (Z), it is desirable that the content of the substance in the layer region (Z) is preferably 30 atomic ppm or less.

In the present invention, a layer region containing a substance capable of controlling the conductive characteristics in one polarity and a layer region containing another substance capable of controlling the conductive characteristics in other polarity can be provided in direct contact with each other in the light receiving layer 102, so that the so called depletion layer can be provided at the contact region. That is, the so called p-n junction is formed by providing a layer region containing said p-type impurity and a layer region containing said n-type impurity in direct contact with each other in the light receiving layer 102 so as to provide a depletion layer.

In the present invention, the light receiving layer 102, made of a-SiGe(H,X), may be formed according to the vaccum deposition method utilizing discharging phenomenon, such as glow discharge method, sputtering method or ion-plating method. For example, for forming the light receiving layer made of a-SiGe(H,X) according to the glow discharge method, the basic procedure comprises introducing a starting gas for Si supply capable of supplying silicon atoms (Si) and a starting gas for Ge supply capable of supplying germanium atoms (Ge), and, if necessary, a starting gas for introduction of hydrogen atoms (H) and/or a starting gas for introduction of halogen atoms (X) into a deposition chamber which can be internally brought to a reduced pressure, and exciting glow discharge in said deposition chamber, thereby forming a layer made of a-SiGe(H,X) on the surface of a substrate placed at a predetermined position. . For nonuniformly distributing the germanium atoms, a layer made of a-SiGe(H,X) may be formed while controlling the depth profile of germanium atoms according to a desired change rate curve. Alternatively, in the formation according to the sputtering method, a target made of Si or two sheets of targets of said target and a target made of Ge, or a target of a mixture of Si and Ge is sputtered in an atmosphere of an inert gas such as Ar, He, etc. or a gas mixture based on these gases by introducing a starting gas for Ge supply, as diluted with a dilution gas such as He, Ar, etc., if desired, and a gas for introduction of hydrogen atoms (H) and/or a gas for introduction of halogen atoms (X), if desired, into a deposition chamber for sputtering, thereby forming a plasma atmosphere of a desired gas. To make non-uniform distribution of the germanium atoms, sputtering of said target is effected, while controlling the gas flow rates of the starting gas for supply of Ge according to a desired change rate curve.

In the case of the ion-plating method, for example, a vaporizing source such as a polycrystalline silicon or a single cyrstalline silicon and a polycrystalline germanium or a single crystalline germanium may be placed as a vaporizing source in an evaporating boat, and the vaporizing source is heated by the resistance heating method or the electron beam method (EB method) and vaporized, and the flying vaporized product is permitted to pass through a desired gas plasma atmosphere, otherwise following the same procedure as in the case of sputtering.

The starting gas for supplying Si to be used in the present invention may include gaseous or gasifiable silicon hydrides (silanes) such as $SiH_4$, $Si_2H_6$, $Si_3H_8$, $Si_4H_{10}$, etc. as effective materials. In particular, $SiH_4$ and $Si_2H_6$ are preferred with respect to easy handling during the layer formation and efficiency for supplying Si.

The substances which can effectively serve as starting gases for Ge supply may include gaseous or gasifiable germanium hydrides such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred with respect to easy handling during the layer formation and efficiency for supplying Ge.

Effective starting gases for introduction of halogen atoms to be used in the present invention may include a large number of halogen compounds, as exemplified preferably by gaseous or gasifiable halogen compounds such as halogen gases, halides, interhalogen compounds, halogen-substituted silane derivatives, and the like.

Further, gaseous or gasifiable silicon hydride compounds containing halogen atoms, that is, the compounds containing silicon atoms and halogen atoms as constituent elements can be mentioned as effective ones in the present invention.

Typical examples of halogen compounds preferably used in the present invention may include halogen gases such as fluorine, chlorine, bromine or iodine, interhalogen compounds such as BrF, ClF, $ClF_3$, $BrF_5$, $BrF_3$, $IF_3$, $IF_7$, ICl, IBr, etc.

The silicon compounds containing halogen atoms, namely, so called silane derivatives substituted with halogen atoms, may be preferably exemplified by silicon halides such as $SiF_4$, $Si_2F_6$, $SiC_4$, $SiBr_4$ and the like.

When the characteristic photoconductive member of the present invention is formed according to the glow discharge method by employment of such a silicon compound containing halogen atoms, it is possible to form the light receiving layer made of a-SiGe containing halogen atoms on a desired substrate without using a silicon hydride gas as the starting gas for Si supply together with the starting gas for Ge supply.

In the case of forming the light receiving layer containing halogen atoms according to the glow discharge method, the basic procedure comprises introducing, for example, a silicon halide as the starting gas for Si supply, germanium hydride as the starting gas for Ge supply and a gas such as Ar, $H_2$, He, etc. in a predetermined mixing ratio into a deposition chamber for forming the light receiving layer and exciting the glow discharge to form a plasma atmosphere of these gases, whereby the light receiving layer can be formed on a desired substrate. In order to control the ratio of hydrogen atoms to be introduced more easily, a hydrogen gas or a gas of a silicon compound containing hydrogen atoms may also be mixed with these gases in a desired amount and used to form the layer.

Also, each gas is not restricted to a single species, but a plurality of species may be available in any desired ratio.

In either case of the sputtering method and the ion-plating method, introduction of halogen atoms into the layer to be formed may be performed by introducing the gas of said halogen compound or said silicon compound containing halogen atoms into a deposition chamber and forming a plasma atmosphere of said gas.

To introduce hydrogen atoms, on the other hand, a starting gas for introduction of hydrogen atoms, for example, $H_2$ or gases such as silanes and/or germanium hydride as mentioned above, may be introduced into a deposition chamber for sputtering, followed by formation of the plasma atmosphere of said gases.

In the present invention, as the starting gas for introduction of halogen atoms, the halogen compounds or halogen-containing silicon compounds as mentioned above can effectively be used. In addition, it is also possible to use effectively as the starting material for formation of the light receiving layer gaseous or gasifiable substances, including halides containing hydrogen atom as one of the constituents, e.g. hydrogen halide such as HF, HCl, HBr, HI, etc.; halogen-substituted silicon hydrides such as $SiH_2F_2$, $SiH_2I_2$, $SiH_2Cl_2$, $SiHCl_3$, $SiH_2Br_2$, $SiHBr_3$, etc.; germanium hydride-halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing hydrogen atoms can preferably be used as the starting material for introduction of halogen atoms, because hydrogen atoms, which are very effective for controlling electrical or photoelectric characteristics, can be introduced into the layer simultaneously with introduction of halogen atoms during formation of the light receiving layer.

To introduce hydrogen atoms structurally into the light receiving layer, $H_2$ or a silicon hydride such as $SiH_4$, $Si_2H_6$, $Si_3H_8$, $Si_4H_{10}$, etc. together with germanium or a germanium compound for supplying Ge, or germanium hydride such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. and together with silicon or a silicon compound for supplying Si can be introduced into a deposition chamber, followed by excitation of discharging, in addition to those as mentioned above.

According to a preferred embodiment of the present invention, the amount of hydrogen atoms (H) or the amount of halogen atoms (X) or the sum total of the amounts of hydrogen atoms and halogen atoms (H+X) existing in the light receiving layer of the photoconductive member is preferably 0.01 to 40 atomic %, more preferably 0.05 to 30 atomic %, and most preferably 0.1 to 25 atomic %.

To control the content of hydrogen atoms (H) and/or halogen atoms (X) existing in the light receiving layer 102, for example, the substrate temperature and/or the introduction rate into the deposition system of the starting materials for adding hydrogen atoms (H) or halogen atoms (X) to the layer, discharging power, etc. may be controlled.

The thickness of the light receiving layer 102 in the photoconductive member 100 of the present invention can be selected as desired so that the photocarrier generated in the light receiving layer can be efficiently transported, and is preferably 1 to 100μ, more preferably 1 to 80μ, and most preferably 2 to 50 μ.

In the present invention, the layer region (N) containing nitrogen atoms can be provided in the light receiving layer 102 by using the starting material for introducing the nitrogen atoms together with the starting material for forming said light receiving layer and adding the nitrogen atoms while controlling their content in the layer, while the light receiving layer 102 is formed.

When the glow discharge method is used to form the layer region (N), the starting material for introducing nitrogen atom is added to the starting material selected, as desired from those for forming the light receiving layer, as mentioned above. As the starting material for introducing nitrogen atoms, most of gaseous substances or gasified substances of gasifiable ones, which contain at least nitrogen atoms as the constituent atoms, can be used.

For example, a starting gas containing silicon atoms (Si) as the constituent atoms, a starting gas containing nitrogen atoms (N) as the constituent atoms and, if necessary, a starting gas containing hydrogen atoms (H) or halogen atoms (X) as the constituent atoms can be used by mixing in a desired mixing ratio, or a starting gas containing silicon atoms (Si) as constituent atoms and a starting gas containing nitrogen atoms (N) and hydrogen atoms (H) as the constituent atoms can be also used by mixing in a desired mixing ratio, or a starting gas containing silicon atoms (Si) as the constituent atoms and a starting gas containing silicon atoms (Si), nitrogen atoms (N) and hydrogen atoms (H) as three species of the constituent atoms can be also used by mixing.

Apart from this, a starting gas containing nitrogen atoms (N) as the constituent atoms can be used by mixing with a starting gas containing silicon atoms (Si) and hydrogen atoms (H) as the constituent atoms.

The starting material effectively used as the starting gas for introduction of nitrogen atoms (N) during formation of the layer region (N), it is possible to use compounds containing N as the constituent atoms or compounds containing N and H as the constituent atoms, such as gaseous or gasifiable nitrogen compounds, nitrides and azides, including for example, nitrogen ($N_2$), ammonia ($NH_3$), hydrazine ($H_2NNH_2$), hydrogen azide ($HN_3$), ammonium azide ($NH_4N_3$) and so on. Alternatively, with the advantage of introducing halogen atoms (X) in addition to nitrogen atoms (N), nitrogen halide compounds such as nitrogen trifluoride ($F_3N$), dinitrogen tetrafluoride ($F_4N_2$) and the like may be also used.

In the present invention, the layer region (N) can further contain oxygen atoms, besides the nitrogen atoms, to further promote the effect obtained by the nitrogen atoms. The starting gas for introducing oxygen atoms into the layer region (N) includes, for example, oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$) and lower siloxanes containing silicon atoms (Si), oxygen atoms (O) and hydrogen atoms (H) as constituent atoms such as disiloxane ($H_3SiOSiH_3$), trisiloxane ($H_3SiOSiH_2OSiH_3$), and the like.

To form the light receiving layer containing nitrogen atom according to the sputtering method, Si wafer or $Si_3N$ wafer of single crystal or polycrystal, or a wafer containing Si and $Si_3N_4$ as a mixture is used as a target for sputtering in various gas atmospheres.

For example, when a Si wafer is used as the target, a starting gas for introducing nitrogen atoms and, if necessary, hydrogen atoms and/or halogen atoms is introduced, as diluted with a dilution gas if necessary, into a deposition chamber for sputtering, and a gas plasma of these gases is formed to sputter said Si wafer.

Apart from this, the sputtering of separate targets of Si and $Si_3N_4$ or a single target of Si and $Si_3N_4$ as a mixture can be carried out in an atmosphere of a dilution gas or in a gas atmosphere containing at least hydrogen atoms (H) and/or halogen atoms (X) as the constituent atoms as a gas for sputtering. As the starting gas for introducing oxygen atoms, a starting gas for introducing nitrogen atoms shown in said example of starting gases for the glow discharge method can be used effectively also for the sputtering.

In the present invention, when the layer region (N) containing nitrogen atoms is provided in the light receiving layer, the layer region (N) having a desired depth profile in the layer thickness direction is formed by changing the content C(N) of nitrogen atoms existing in the layer region (N) in the layer thickness direction.

According to the glow discharge method, the content C(N) is changed by introducing into a deposition chamber a gas of the starting material for introducing nitrogen atoms, while appropriately changing the gas flow rate according to a desired change rate curve. This can be done, for example, by gradually changing the opening of a given needle valve provided in the gas line by the ordinary means, for example, manually or by an outside driving motor, or the like. In that case, the change rate for the flow rate is not necessarily linear, but the flow rate can be controlled according to a predetermined change rate curve by means of, for example, a microcomputer, etc. to obtain the desired content curve.

When the layer region (N) is formed according to the sputtering method by changing the content C(N) of nitrogen atoms in the layer thickness direction, thereby obtaining a desired depth profile of nitrogen atoms in the layer thickness direction, the desired depth profile can be obtained firstly by using a gaseous starting material for introducing nitrogen atoms as in the case of the glow discharging method, and appropriately changing the gas flow rate as desired during introduction of the gas into a deposition chamber.

Secondly, when a target for sputtering, for example, a target of Si and $Si_3N_4$ as a mixture, is used, the desired depth profile can be obtained by changing a mixing ratio of Si to $Si_3N_4$ in the layer thickness direction of the target in advance.

The substance (C) capable of controlling the conductive characteristics, for example, the group III atoms or the group V atoms, can be structurally introduced into the light receiving layer 102 by introducing a gaseous starting material for introducing the group III atoms or a gaseous starting material for introducing the group V atoms into a deposition chamber together with other straring materials for forming the light receiving layer during formation of the layer. As the starting material for introduction of the group III atoms, it is desirable to use those which are gaseous at room temperature under atmospheric pressure or can readily be gasified at least under layer forming conditions. Typical examples of such starting materials for introduction of the group III atoms may include, particularly the compounds for introduction of boron atoms, boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Furthermore it is also possible to use $AlCl_3$, $GeCl_3$, $Ge(CH_3)_3$, $InCl_3$, $TlCl_3$ and the like.

The starting materials which can effectively be used in the present invention for introduction of the group V atoms may include, for introduction of phosphorus atoms, phosphorus hydride such as $PH_3$, $P_2H_4$, etc. phosphorus halides such as $PH_4I$, $PF_3$, $PF_5$, $PCl_5$, $PCl_3$, $PBr_3$, $PBr_5$, $PI_3$ and the like. Furthermore, it is also possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and the like effectively as the starting material for introduction of the group V atoms.

The layer thickness of the layer region which constitutes the light receiving layer 102 and contains a substance (C) capable of controlling the conductive characteristics and which is provided particularly toward the substrate 101 side in the present invention can be selected as desired in view of the characteristics required for said layer region and other layer region formed on said layer region also to constitute the light receiving layer 102. It is desired that its lower limit is preferably 30Å or more, more preferably 40Å or more, and most preferably 50Å or more.

When the content of a substance existing in said layer region to control the conductive characteristics is 30 atomic ppm or more, it is desired that the upper limit to the thickness of said layer region is preferably 10μ or less, more preferably 8μ or less, and most preferably 5μ or less.

The substrate to be used in the present invention may be either electroconductive material or insulating material. The electroconductive material may be exemplified by metals such as NiCr, stainless steel, Al, Cr, Mo, Au, Nb, Ta, V, Ti, Pt, Pd etc. or alloys thereof.

The insulating substrate may be exemplified by usually used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one surface of these insulating substrates should preferably be subjected to electroconductive treatment, and it is desirable to provide other layers on the surface which has been subjected to said electroconductive treatment.

For example, the surface of a glass can be given an electroconductivity by providing a thin film of NiCr, Al, Cr, Mo, Au, Ir, Nb, Ta, V, Ti, Pt,·Pd, $In_2O_3$, $SnO_2$, ITO ($In_2O_3+SnO_2$), etc. thereon. Alternatively, the surface of a synthetic resin film such as polyester film can be given an electroconductivity by vacuum vapor deposition, electronbeam deposition or sputtering of a thin film of metal such as NiCr, Al, Ag, Pd, Zn, Ni, Au, Cr, Mo, Ir, Nb, Ta, V, Ti, Pt, etc. or by laminating treatment with said metal. The substrate may be shaped in any form such as cylinders, belts, plates or others, and its form may be selected as desired. For example, when the photoconductive member 100 in FIG. 1 is to be used as an image forming member for electrophotography, it may desirably be formed into an endless belt or a cylinder for use in continuous high speed copying. The substrate may have a thickness, which can be selected as desired so that a photoconductive member as desired may be formed. When the photoconductive member is required to have a flexibility, the substrate is made as thin as possible, so far as the function of a substrate can be sufficiently exhibited. However, in such a case, the thickness is preferably 10μ or more from the viewpoints of fabrication and handling of the substrate as well as its mechanical strength.

Figure 15:
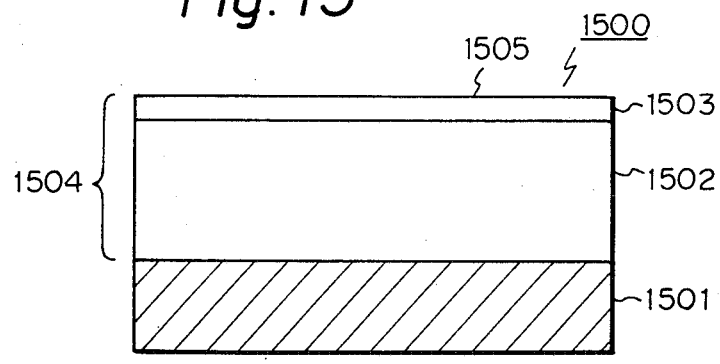
FIG. 15 shows a schematic illustration of the device used in the present invention.

FIG. 15 shows a schematic illustration for explanation of the layer constitution of the photoconductive member according to the preferable second embodiment of the present invention.

The photoconductive member 1500 shown in FIG. 15 has a substrate 1501 for the photoconductive member, a first layer (I) 1502 provided on the substrate 1501, and a second layer (II) 1503 provided on the first layer (I) 1502, the second layer having a free surface 1505. The first layer (I) 1502 is made of a-SiGe(H,X), and contains nitrogen atoms and has a photoconductivity. A light receiving layer 1504 comprises the first layer (I) 1502 and the second layer (II) 1503.

The photoconductive member 1500 shown in FIG. 15 has a layer constitution similar to that of the photoconductive member 100 shown in FIG. 1, except that the second layer (II) 1503 is provided on the first layer (I) 1502. That is, the first layer (I) 1502 corresponds to the light receiving layer 102 shown in FIG. 1, and all the descriptions so far made in detail as to the light receiving layer 102 can be also applied to the first layer (I) 1504.

In the photoconductive member 1500 shown in FIG. 15, the second layer (II) 1503 formed on the first layer (I) 1502 has a free surface 1504, and is provided for accomplishing the objects of the present invention primarily in humidity resistance, continuous repeated use characteristic, dielectric strength, use environment characteristic and durability.

In the present invention, the second layer (II) 1503 is made of an amorphous material containing silicon atoms (Si) and at least one of carbon atoms (C) and oxygen atoms (0), and, if necessary at least one of hydrogen atoms (H) and halogen atoms (X).

Thus, the respective amorphous materials constituting the first layer (I) 1502 and the second layer (II) 1503 have the common constituent of silicon atom, and therefore chemical stability is sufficiently ensured at the interface between both layers (I) 1502 and (II) 1503.

The amorphous material constituting the second layer (II) may include an amorphous material containing silicon atoms (Si) and carbon atoms (C), and if necessary, hydrogen atoms (H) and/or halogen atoms (X) (hereinafter referred to "(a-$Si_xC_{1-x})_y$(H,X)$_{1-y}$", wherein $0<x$, $y<1$), and an amorphous material containing silicon atoms (Si) and oxygen atoms (O), and, if necessary, hydrogen atoms (H) and/or halogen atoms (X) (hereinafter referred to as "a-$(Si_xO_{1-x})_y$(H,X)$_{1-y}$", wherein $0<x$, $y<1$).

The second amorphous layer (II) may be formed according to the glow discharge method, the sputtering method, the ion-implantation method, the ion-plating method, the electron beam method, etc. These preparation methods may be suitably selected in view of various factors such as the preparation conditions, the extent of the load for capital investment for installations, the production scale, the desirable characteristics required for the photoconductive member to be prepared, etc. With the advantages of relatively easy control of the preparation conditions for preparing photoconductive members having desired charactersitics and easy introduction of silicon atoms, oxygen atoms, hydrogen atoms and halogen atoms, respectively, into the second layer (II) to be prepared, the glow discharge method or the sputtering method are preferably employed.

Further, in the present invention, the glow discharge method and the sputtering method may be used in combination in the same system to form the second layer (II).

For formation of the second layer (II) according to the glow discharge method, starting gases for formation of the second layer (II), which may, if necessary, be mixed with a dilution gas in a predetermined mixing ratio, may be introduced into a deposition chamber for vacuum deposition in which a substrate is placed, and glow discharge is excited in said deposition chamber to form gas plasma, thereby depositing the amorphous material for formation of the second layer (II) on the first layer (I) already formed on the substrate.

In the present invention, the starting gases for formation of the second layer (II) 103 may be exemplified by most of substances containing at least one of silicon atoms, carbon atoms, oxygen atoms, hydrogen atoms and halogen atoms as constituent atoms which are gaseous or gasified substances of readily gasifiable ones.

In the present invention, the starting gases which can be effectively used for formation of the second layer (II) 103 may include those which are gaseous under conditions of room temperature and atmospheric pressure or can be readily gasified.

In the present invention, the starting gases effectively used for formation of the second amorphous layer (II) may include silicon hydride gases containing silicon atoms and hydrogen atoms as constituent atoms such as silanes, for example, $SiH_4$, $Si_2H_6$, $Si_3H_8$, $Si_4H_{10}$, etc., compounds containing carbon atoms and hydrogen atoms as constituent atoms such as saturated hydrocarbons having 1 to 4 carbon atoms, ethylenic hydrocarbons having 2 to 4 carbon atoms and acetylenic hydrocarbons having 2 to 3 carbon atoms, single substances or compound containing oxygen atoms as constituent atoms, single substances of halogen, hydrogen halides, interhalogen compounds, silicon halide, halogen substituted silicon hydride, etc.

More specifically, they may include, as the saturated hydrocarbons, methane ($CH_4$), ethane ($C_2H_6$), propane ($C_3H_8$), n-butane (n-$C_4H_{10}$), pentane ($C_5H_{12}$); as the ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as the acetylenic hydrocarbons, acetylene ($C_2H_2$), methyl acetylene ($C_3H_4$), butyne ($C_4H_6$); as the single substances of halogen, fluorine, chlorine, bromine and iodine; as the hydrogen halides, HF, HI, HCl and HBr; as the interharogen compounds, $BrF$, $ClF$, $ClF_3$, $ClF_5$, $BrF_5$, $BrF_3$, $IF_5$, $IF_7$, $ICl$, $IBr$; as the silicon halides, $SiF_4$, $Si_2F_6$, $SiCl_4$, $SiCl_3Br$, $SiCl_2Br_2$, $SiClBr_3$, $SiCl_3I$, $SiBr_4$; as the halogen substituted silicon hydride, $SiH_2F_2$, $SiH_2Cl_2$, $SiHCl_3$, $SiH_3Cl$, $SiH_3Br$, $SiH_2Br_2$, $SiHBr_3$, etc.; and so on.

Besides, it is also possible to use halogen-substituted paraffinic hydrocarbons such as $CF_4$, $CCL_4$, $CBr_4$, $CHF_3$, $CH_2F_2$, $CH_3F$, $CH_3Cl$, $CH_3Br$, $CH_3I$, $C_2H_5Cl$, etc.; fluorinated sulfur compounds such as $SF_4$, $SF_6$, etc; silane derivatives, including alkyl silanes such as $Si(CH_3)_4$, $Si(C_2H_5)_4$, etc. and halogen-containing alkyl silanes such as $SiCl(CH_3)_3$, $SiCl_2(CH_3)_2$, $SiCl_3CH_3$, etc. as effective ones.

The starting material effectively used as the starting gas for introduction of oxygen atoms (O) to be used during the formation of the second layer (II), it is possible to use compounds containing oxygen atoms as constituent atoms or compounds containing nitrogen atoms and oxygen atoms as constituent atoms, such as oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms, oxygen atoms and hydrogen atoms as constituent atoms such as disiloxane ($H_3SiOSiH_3$), trisiloxane ($H_3SiOSiH_2OSiH_3$), and the like.

These materials for formation of the second layer (II) may be selected and used as desired in formation of the second layer (II) so that silicon atoms, carbon atoms, oxygen atoms, hydrogen atoms and halogen atoms may exist in a predetermined composition ratio in the second layer (II).

For example, $Si(CH_3)_4$ as the material capable of easily adding silicon atoms, carbon atoms and hydrogen atoms and forming a layer having desired characteristics and $SiHCl_3$, $SiCl_4$, $SiH_2Cl_2$ or $SiH_3Cl$ as the material for adding halogen atoms may be mixed in a predetermined mixing ratio and introduced under a gaseous state into a device for formation of a second layer (II), followed by excitation of glow discharge, whereby a second layer (II) comprising a-$(Si_xC_{1-x})_y(Cl+H)_{1-y}$ can be formed.

For formation of the second layer (II) according to the sputtering method, any of single crystalline or polycrystalline Si wafer, graphite wafer, $SiO_2$ wafer and wafer containing silicon atom, carbon atom and/or oxygen atom as mixed therein is used as a target and subjected to sputtering in an atmosphere of various gases containing, if necessary, halogen atoms and/or hydrogen atoms as constituents. For example, when a silicon wafer is used as a target, starting gases for introducing carbon atoms and/or oxygen atoms and hydrogen atoms and/or halogen atoms which may be diluted with a dilution gas, if desired, are introduced into a deposition chamber for sputtering form a gas plasma of these gases therein and effect sputtering of said silicon wafer.

Alternatively, silicon atoms and/or carbon atoms and/or oxygen atoms as separate targets or one target sheet of a mixture of silicon atoms, carbon atoms and/or oxygen atoms can be used and sputtering is effected in a gas atmosphere containing, if desired, hydrogen atoms and/or halogen atoms. As the starting gases for introduction of carbon atoms, oxygen atoms, hydrogen atoms and halogen atoms, substances for forming the second layer (II) as shown in the example of the glow discharge method as described above can be used as effective materials also for the sputtering.

In the present invention, the dilution gas to be used in formation of the second layer (II) by the glow discharge method or the sputtering method may include the so called rare gases such as He, Ne and Ar as preferable ones.

The second layer (II) in the present invention should be carefully formed so that the required characteristics may be given exactly as desired. That is, the substance containing silicon atoms, carbon atoms and/or oxygen atoms, and, if necessary, hydrogen atoms and/or halogen atoms as the constituent atoms can take structural forms ranging from crystalline to amorphous and show electrical properties ranging from conductive through semi-conductive to insulating and photoconductive properties ranging from photoconductive to non-photoconductive. Therefore, in the present invention, the preparation conditions are strictly selected as desired so as to form an amorphous material for constituting the second layer (II) having characteristics desired for the purpose. For example, when the second layer (II) is to be provided primarily for the purpose of improvement of dielectric strength, the amorphous material for constituting the second layer (II) is prepared as an amorphous material having marked electric insulating behaviours under the service environment.

Alternatively, when the primary purpose for the second layer (II) is an improvement of continuous repeated use characteristics or service environmental characteristics, the degree of the above electric insulating property may be alleviated to some extent and the aforesaid amorphous material may be prepared as an amorphous material having a sensitivity to some extent to the irradiation light.

In forming the second layer (II) on the surface of the first layer (I), the substrate temperature during the layer formation is an important factor having influences on the constitution and the characteristics of the layer to be formed, and it is desired in the present invention to strictly control the substrate temperature during the layer formation so as to obtain the second layer (II) having the desired characteristics.

For forming the second layer (II), an optimum temperature range is selected in conformity with the method for forming the second layer (II) to effectively attain the desired objects of the present invention. During the formation of the layer, the substrate temperature is preferably 20° to 400° C., more preferably 50° to 350° C., and most preferably 100° to 300° C.

For the formation of the second layer (II), the glow discharge method or the sputtering method may be advantageously used, because fine control of the composition ratio of atoms existing in the layer or control of layer thickness can be conducted with relative ease as compared with other methods. In case that the second layer (II) is formed according to these layer forming methods, the discharging power during the formation of the layer is one of important factors influencing the characteristics of the second layer (II) similarly to the aforesaid substrate temperature.

The discharging power condition for the effective preparation with a good productivity of the second layer (II) having characteristics for accomplishing the objects of the present invention may preferably be 10 to 300 W, more preferably 20 to 250 W, and most preferably 50 to 200 W.

The gas pressure in a deposition chamber may preferably be 0.01 to 1 Torr, and more preferably 0.1 to 0.5 Torr.

In the present invention, the above numerical ranges can be mentioned as preferable ones for the substrate temperature, discharging power for the preparation of the second layer (II). However, these factors for the formation of the layer are not selected separately and independently of each other, but it is desirable that the optimum values of respective layer forming factors are selected on the basis of mutual organic relationships so that the second layer (II) having desired characteristics may be formed.

The contents of carbon atoms, and/or oxygen atoms existing in the second layer (II) are important factors for obtaining the desired characteristics to accomplish the objects of the present invention, similarly to the conditions for preparation of the second layer (II). The contents of carbon atoms and/or oxygen atoms existing in the second layer (II) in the present invention are selected as desired in view of the species of amorphous material constituting the second layer (II) and its characteristics.

More specifically, the amorphous material represented by the above formula $a\text{-}(Si_xC_{1-x})_y(H,X)_{1-y}$ may be roughly classified into an amorphous material constituted of silicon atoms and carbon atoms (hereinafter referred to as "$a\text{-}Si_aC_{1-a}$", whre $0<a<1$), an amorphous material constituted of silicon atoms, carbon atoms and hydrogen atoms (hereinafter referred to as $a\text{-}(Si_bC_{1-b})_cH_{1-c}$, where $0<b$, $c<1$) and an amorphous material constituted of silicon atoms, carbon atoms, halogen atoms and, if necessary, hydrogen atoms (hereinafter referred to as "$a\text{-}(Si_dC_{1-d})_e(H,X)_{1-e}$", where $0<d$, $e<1$).

In the present invention, when the second layere (II) is made of $a\text{-}Si_aC_{1-a}$, the content of carbon atoms in the second layer (II) may be preferably $1\times10^{-3}$ to 90 atomic %, more preferably 1 to 80 atomic %, and most preferably 10 to 75 atomic %, namely in terms of representation by a in the above $a\text{-}Si_aC_{1-a}$, a being preferably 0.1 to 0.99999, more preferably 0.2 to 0.99, and most preferably 0.25 to 0.9.

In the present invention, when the second layer (II) is made of $a\text{-}(Si_bC_{1-b})_cH_{1-c}$, the content of carbon atoms in the second layer (II) may be preferably $1\times10^{-3}$ to 90 atomic %, more preferably 1 to 90 atomic %, and most preferably 10 to 80 atomic %, the content of hydrogen atoms preferably 1 to 40 atomic %, more preferably 2 to 35 atomic %, and most preferably 5 to 30 atomic %, and the photoconductive member formed when the hydrogen content is within these ranges can be sufficiently applicable as excellent one in the practical aspect.

That is, in terms of the representation by the above $a\text{-}(Si_bC_{1-b})_cH_{1-c}$, b is preferably 0.1 to 0.99999, more preferably 0.1 to 0.99, and most preferably 0.15 to 0.9, and c preferably 0.6 to 0.99, more preferably 0.65 to 0.98, and most preferably 0.7 to 0.95.

When the second layer (II) is made of $a\text{-}(Si_dC_{1-d})_e(H,X)_{1-e}$, the content of carbon atoms in the second layer (II) may be preferably $1\times10^{-3}$ to 90 atomic %, more preferably 1 to 90 atomic %, and most preferably 10 to 80 atomic %, the content of halogen atoms preferably 1 to 20 atomic %, more preferably 1 to 18 atomic %, and most preferably 2 to 15 atomic %. When the content of halogen atoms is within these ranges, the photoconductive member thus prepared is sufficiently applicable in the practical aspect. The content of hydrogen atoms contained if desired may be preferably 19 atomic % or less, and more preferably 13 atomic % or less.

That is, in terms of representation by d and e in the above $a\text{-}(Si_dC_{1-d})_e(H,X)_{1-e}$, d is preferably 0.1 to 0.99999, more preferably 0.1 to 0.99, and most preferably 0.15 to 0.9, and e preferably 0.8 to 0.99, more preferably 0.82 to 0.99, and most preferably 0.85 to 0.98.

On the other hand, the amorphous material represented by the above formual $a\text{-}(Si_xO_{1-x})_y(H,X)_{1-y}$ may be roughly classified into an amorphous material constituted of silicon atoms and oxygen atoms (hereinafter referred to as "$a\text{-}Si_aO_{1-a}$", where $(0<a<1)$), an amorphous material constituted of silicon atoms, oxygen atoms and hydrogen atoms (hereinafter referred to as $a\text{-}(Si_bO_{1-b})_cH_{1-c}$, whrer $0<b$, $c<1$) and an amorphous material constituted of silicon atoms, oxygen atoms, halogen atoms and, if desired, hydrogen atoms (hereinafter referred to as "$a\text{-}(Si_dO_{1-d})_e(H,X)_{1-e}$", where $0<d$, $e<1$).

In the present invention, when the second layer (II) is to be constituted of $a\text{-}Si_aO_{1-a}$, the content of oxygen atoms in the second layer (II) may be preferably 0.33 to 0.99999, more preferably 0.5 to 0.99, and most preferably 0.6 to 0.9, in terms of a in the above formula $a\text{-}Si_{a1/a}$.

In the present invention, when the second layer (II) is made of $a\text{-}(Si_bO_{1-b})_cH_{1-c}$, the content of oxygen atoms in the second layer (II) may be preferably such that b in the above formula $a\text{-}(Si_bO_{1-b})_cH_{1-c}$ may be preferably 0.33 to 0.99999, more preferably be 0.5 to 0.9, and most preferably 0.6 to 0.9, and c preferably 0.6 to 0.99, more preferably 0.65 to 0.98, and most preferably 0.7 to 0.95.

When the second layer (II) is made of a-$(Si_dO_{1-d})_e(H,X)_{1-e}$, the content of oxygen atoms in the second layer (II) may be preferably such that d in the above formula a-$(Si_dO_{1-d})_e(H,X)_{1-e}$ may be preferably 0.33 to 0.99999, more preferably be 0.5 to 0.99, and most preferably 0.6 to 0.9, and e preferably 0.8 to 0.99, more preferably 0.82 to 0.99, and most preferably 0.85 to 0.98. It is preferably 90 atomic % or less, more preferably 80 atomic % or less, and most preferably 70 atomic % or less on the basis of sum total of (H+X).

The range of the numerical value of layer thickness of the second layer (II) is one of the important factors for effectively accomplishing the objects of the present invention, and is selected as desired in view of the intended purpose so as to effectively accomplish the objects of the present invention.

The layer thickness of the second layer (II) must be also selected as desired with due considerations about the relationships with the contents of carbon atoms, and/or oxygen atoms, the relationship with the layer thickness of the first layer (I), as well as other organic relationships to the characteristics required for respective layer regions.

In addition, the layer thickness is desirably given considerations from economical viewpoint such as productivity or capability of mass production.

The second layer (II) in the present invention desirably has a layer thickness preferably of 0.003 to 30μ, more preferably 0.004 to 20μ, and most preferably 0.005 to 10μ.

The halogen atoms existing in the second layer (II) of the present invention are preferably fluorine, chlorine, bromine and iodine, among which fluorine and chlorine are desirable.

Figure 16:
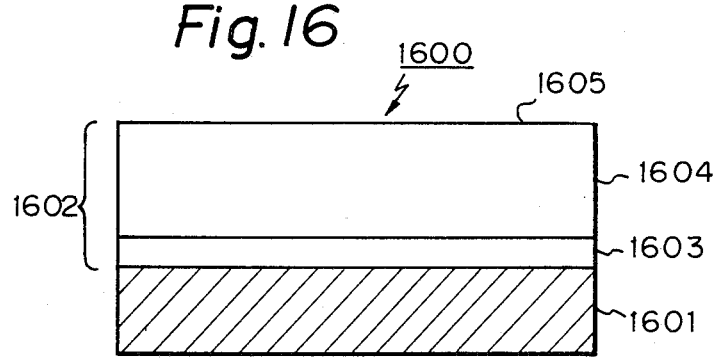
FIGS. 16 and 17 each shows an illustration for explanation of the depth profiles of the respective atoms in Examples of the present invention.

FIG. 16 is a schematic sectional view showing the layer constitution of a photoconductive member according to a preferable third embodiment of the present invention.

The photoconductive member 1600 shown in FIG. 16 has a light receiving layer 1602 on a substrate 1601 for the photoconductive member, the light receiving layer 1602 having a free surface 1605 on its one end.

The light receiving layer 1602 has a layer structure comprising a first layer region (G) 1603 made of a-Ge(-Si,H,X) and a photoconductive second layer region (S) 1604 made of a-Si(H,X), the first layer region and the second layer region being laid on each other in this order from the substrate 1601 side.

The germanium atoms existing in the first layer region (G) 1603 may be uniformly distributed without exception in the first layer region (G) 1603, or may be distributed without exception in the layer thickness direction but not uniformly in the content of germanium atoms in depth profile. In any case, however, it is necessary that the germanium atoms are distributed uniformly and contained without exception in the interplanar direction, i.e. the direction parallel to the substrate surface, to make the characteristics uniform in the interplanar direction. The germanium atoms are particularly so contained in the first layer region (G) 1603 that they should be contained without exception in the layer thickness direction of the light receiving layer 1602 and should be more distributed toward the substrate 1601 side than the side opposite to the substrate 1601-provide side (i.e. the free surface 1605 side of the light receiving layer 1602), or they should take quite a reversed depth profile.

In the photoconductive member shown in FIG. 16, it is desirable that the germanium atoms existing in said first layer region (G) 1603 can take said depth profile in the layer thickness direction and a uniform distribution state in the interplanar direction in parallel to the substrate surface.

In the photoconductive member shown in FIG. 16, no germanium atoms exist in the second layer region(S) 1604 provided on the first layer region (G) 1603. By making the light receiving layer 1502 having such a layer constitution, a photoconductive member having a distinguished photosensitivity to the whole region of wavelength ranging from the relatively short wavelength to the relatively long wavelength, including the visible light region can be obtained.

In a preferable embodiment, the depth profile of germanium atoms in the first layer region (G) 1603 is such that the germanium atoms are continuously distributed throughout the whole layer region and the content C of the germanium atoms is decreased toward the second layer region (S) 1603 from the substrate 1601 side, and thus a distinguished affinity can be obtained between the first layer region (G) 1603 and the second layer region (S) 1604. When a semiconductor is used, an extreme high concentration of germanium at the end portion of the layer region facing the substrate will prevent the interference caused by the reflection at the substrate surface of longer wave-length light which is scarecely absorbed by the second layer region (S) 1603, since the high concentration of germanium enable substantially complete absorption of the light of the wavelength.

When the silicon atoms exist in the first layer region (G) 1603 in the photoconductive member 1600 shown in FIG. 16, the amorphous materials for the first layer region (G) 1603 and the second layer region (S) 1604 have such a common constitution factor that the silicon atoms are common thereto. Thus, a chemical stability can be ensured at the interface therebetween.

Typical examples that the depth profile in the layer thickness direction of germanium atoms existing in the first layer region (G) 1603 in the photoconductive member 1600 shown in FIG. 16 is non-uniform are shown in FIG. 2 through FIG. 10 for the illustration of the photoconductive member 100 shown in FIG. 1.

For the illustration of the photoconductive member 1600 shown in FIG. 16, the ordinate of FIG. 2 through FIG. 10 will show the thickness of the first layer region (G) 1603, $t_B$ the position of the end surface of the first layer region (G) 1603 on the substrate side, and $t_T$ the position of the end surface of the first layer region (G) 1603 on the opposite side to the substrate side.

In the photoconductive member 1600 shown in FIG. 16, the content of germanium atoms existing in the first layer region (G) 1603 can be selected as desired so as to effectively accomplish the objects of the present invention, and is preferably 1 to $1\times10^6$ atomic ppm, more preferably 100 to $9.5\times10^5$ atomic ppm, and most preferably 500 to $8\times10^5$ atomic ppm, on the basis of sum total with the silicon atoms existing in the first layer region (G) 1603.

The thickness each of the first layer region (G) 1603 and the second layer region (S) 1604 is one of important factors for effectively accomplishing the objects of the present invention, and must be carefully selected in designing the photoconductive member to thoroughly give the desired characteristics to the photoconductive member.

In the present invention, the thickness $T_B$ of the first layer region (G) 1603 is preferably 30 Å to 50μ, more preferably 40 Å to 40μ, and most preferably 50 Å to 30μ. The thickness T of the second layer region (S) 1604 is preferably 0.5 to 90μ, more preferably 1 to 80μ, and most preferably 2 to 50μ.

Sum total of the thickness $T_B$ of the first layer region (G) 1603 and the thickness T of the second layer region (S) 1604, i.e. ($T_B$+T) is selected as desired in view of mutual organic relationships between the characteristics required for both layer regions and the charactersitics required for the whole light receiving layer 1602 in designing the layer constitution of the photoconductive member 1600.

In the photoconductive member shown in FIG. 16, the numerical range for ($T_B$+T) is preferably 1 to 100μ, more preferably 1 to 80μ, and most preferably 2 to 50μ.

In a more preferable embodiment of the present invention, the thickness $T_B$ and thickness T is selected as desired so as to satisfy a relationship of preferably $T_B/T \leq 1$, more preferalby $T_B/T \leq 0.9$ and most preferably $T_B/T \leq 0.8$.

When the content of germanium atoms existing in the first layer region (G) is $1 \times 10^5$ atomic ppm or more, the thickness $T_B$ of the first layer region (G) 1603 is desirably as small as possible, and is preferably 30μ or less, more preferably 25μ or less, and most preferably 20μ or less.

The halogen atoms (X) existing in the first layer region (G) 1603 and/or the second layer region (S) 1604 for the light receiving layer 1602 may include, for example, fluorine, chlorine, bromine, and iodine, among which fluorine and chlorine are preferable.

In the photoconductive member 1600 shown in FIG. 16, a layer region (N) containing nitrogen atoms is provided in the light receiving layer 1602 to attain a higher photosensitization, and a higher dark resistance and to improve the adhesion between the substrate 1601 and the light receiving layer 1602, where the depth profile of nitrogen atoms existing in the light receiving layer 1602 and the manner to provide the layer region (N) are the same as those for the photoconductive member 100 shown in FIG. 1.

In the present invention, the first layer region (G) made of a-Ge(Si,H,X) can be formed according to a vacuum deposition method utilizing an electric discharge phenomenon as that for a-SiGe(H,X). For example, the first layer region (G) made of a-Ge (Si,H,X) can be formed according to a glow discharge method basically by introducing a starting gas for Ge supply capable of supplying germanium atoms (Ge), and if necessary, a starting gas for Si supply capable of supplying silicon atoms (Si), a starting gas for introducing hydrogen atoms (H) and/or a starting gas for introducing halogen atoms (X) into a deposition chamber, whose inside can be made subatmospheric, under a desired gas pressure, and exciting glow discharge in the deposition chamber, thereby forming a layer made of a-Ge(Si,H,X) on a predetermined substrate surface placed at the predetermined position.

To contain the germanium atoms in a non-uniform depth profile, a layer made of a-Ge(Si,H,X) is formed while controlling the content of germanium atoms according to a change rate curve.

The layer can be also formed according to the sputtering method, for example, by using a target made of Si, or two targets, i.e, said target and a target made of Ge, or a target made of Si and Ge as a mixture in an inert gas of Ar, He, etc. or in an atmosphere of a gas mixture based on said gases, and if necessary, introducing a starting gas for Ge supply, diluted with a dilution gas such as He, Ar, etc. or, if necessary, a gas for introducing hydrogen atoms (H) and/or halogen atoms (X) into a deposition chamber for sputtering, followed by generating a plasma atmosphere of desired gas. To make non-uniform distribution of germanium atoms, for example, the target is sputtered while controlling the gas flow rate of the starting gas for Ge supply according to a desired change rate curve.

In the present invention, all the starting gases already described as to the formation of the layer made of a-SiGe(H,X) can be used as the starting gas for forming the first layer region (G).

In the photoconductive member 1500 shown in FIG. 15, the second layer region (S)1504 made of a-Si(H,X) can be formed according to the same procedure and conditions as used for forming the first layer region (G) 1503 by using the starting materials excluding the starting material that can serve as the starting gas for Ge supply from the starting materials (I) for forming said first layer region (S) [starting materials (II) for forming the second layer region (S) 1504].

That is, in the present invention, the second layer region (S) made of a-Si(H,X) can be formed according to a vacuum deposition method utilizing an electric discharge phenomenon, for example, a glow discharge method, a sputtering method, an ion-plating method, etc. For example, the second layer region (S) 1504 made of a-Si(H,X) can be formed according to a glow discharge method basically by introducing said starting gas for Si supply capable of supplying silicon atoms (Si), if necessary, together with a starting gas for introducing hydrogen atoms and/or a starting gas for introducing halogen atoms (X) into a deposition chamber, whose inside can be made subatmospheric, and exciting glow discharge in the deposition chamber, thereby forming a layer made of a-Si(H,X) on the predetermined substrate surface placed at the predetermined position.

The layer can be also formed according to a sputtering method, for example, by introducing a gas for introducing hydrogen atoms (H) and/or halogen atoms (X) into a deposition chamber for sputtering, when a target made of Si is sputtered in an inert gas of Ar, He, etc, or in an atmosphere of a gas mixture based on said gases.

The content of hydrogen atoms (H) or halogen atoms (X), or sum total of hydrogen atoms and halogen atoms(H+X) existing in the first layer region (G) is preferably 0.01 to 40 atomic %, more preferably 0.05 to 30 atomic %, and most preferably 0.1 to 25 atomic %.

The content of hydrogen atoms (H) or halogen atoms (X), or sum total of hydrogen atoms and halogen atoms (H+X) existing in the second layer region (G) is preferably 1 to 40 atomic %, more preferably 5 to 30 atomic %, and most preferably 5 to 25 atomic %.

Descriptions made as to the photoconductive member 100 shown in FIG. 1 can be also applied to the corresponding parts of the photoconductive member 1600 shown in FIG. 16. Thus, those so far omitted from the descriptions of the photoconductive member 1600 should be referred to the descriptions of the photoconductive member 100 shown in FIG. 1.

Figure 17:
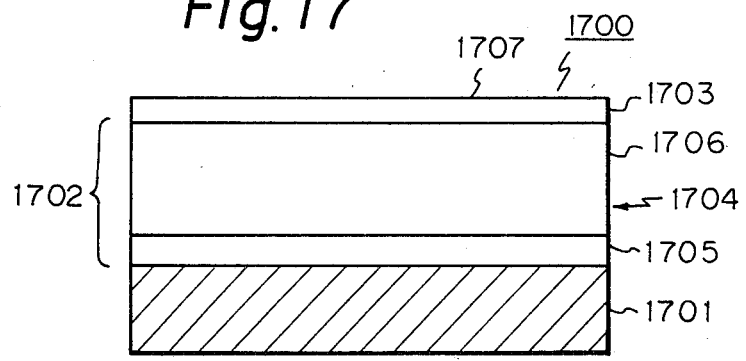

FIG. 17 is a schematic cross-sectional view showing the layer constitution of a photoconductive member according to a preferable fourth embodiment of the present invention.

The photoconductive member 1700 shown in FIG. 17 has a substrate 1701 for the photoconductive member, a first layer (I) 1702 provided on the substrate 1701, and a second layer (II) 1703 provided on the first layer (I) 1702, and has the same constitution as that of the photoconductive member 1600 shown in FIG. 16 except for the second layer (II) 1703 in the photoconductive member 1700. The light receiving layer 1704 is constituted of the first layer (I) 1702 and the second layer (II) 1703. That is, the first layer (I) 1702 corresponds to the light receiving layer 1602; the first layer region (G) 1704 to the first layer region (G) 1603; and the second layer region (G) 1705 to the second layer region (S) 1604, and all the descriptions so far made as to the light receiving layer 1602 in FIG. 16 are also applicable to the first layer (I) 1702. The second layer (II) 1703 is the same layer as the second layer (II) 1503 of the photoconductive member 1500 shown in FIG. 15, and all the descriptions so far made as to the second layer (II) 1503 can be also applied to the second layer (II) 1703.

The photoconductive member of the present invention so designed as to have the layer structure so far described in detail can solve all of the afore-mentioned problems, and shows very distinguished electrical, optical and photoconductive characteristics and also distingiushed dielectric strength and service environmental characteristics.

Particularly when applied to an image-forming member for the electrophotography, the present photoconductive member has no influence of residual potential on the image formation, stable electric characteristics, a higher sensitivity, a high SN ratio, a high light fatigue resistance, longer repeated use characteristics, a clear halftone, and a high resolution, and can produce high quality images stably and repeatedly.

Furthermore, the present photoconductive member can be used continuously and repeatedly at a high speed for a long time, since the light receiving layer itself formed on the substrate is tough and considerably distinguished in the adhesion to the substrate.

Still furthermore, the present photoconductive member has a high photosensitivity in the whole visible light region, a good matching particularly to semi-conductor laser and a high response to light.

Next, an example of the process for producing the photoconductive member of this invention is to be briefly described.

Figure 18:
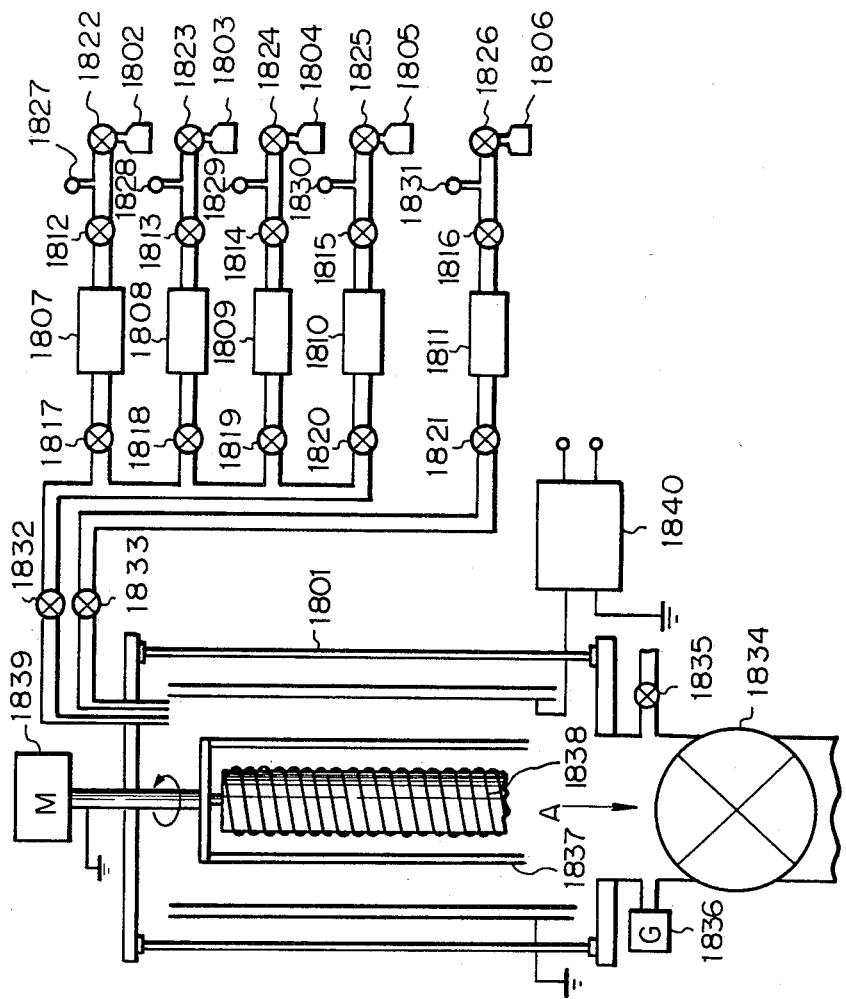
FIG. 18 schematically shows an apparatus which may be used for producing a photoconductive member.

FIG. 18 shows one example of an apparatus for producing a photoconductive member.

Gas cylinders 1802 to 1806 hermetically contain starting gases for formation of the photosensitive member of the present invention. For example, cylinder 1802 contains $SiH_4$ gas diluted with He (purity: 99.999%, hereinafter referred to as $SiH_4$/He), cylinder 1803 contains $GeH_4$ gas diluted with He (purity: 99.999%, hereinafter referred to as $GeH_4$/He), cylinder 1804 contains $SiF_4$ gas diluted with He (purity 99.999%, hereinafter referred to as $SiF_4$/He), cylinder 1805 contains $NH_3$ gas (purity: 99.999%) and cylinder 1806 contains $H_2$ gas (purity: 99.999%).

These gases are led into a reaction chamber 1801, after confirmation of valves 1822–1826 to the gas cylinders 1802–1806 and leak valve 1835 as closed, and inflow valves 1812–1816, outflow valves 1817–1821, auxiliary valves 1832 and 1833 as opened, by opening main valve 1834 at first to evacuate the reaction chamber 1801 and gas pipelines, and when vacuum indicator 1836 indicates $5 \times 10^{-6}$ Torr, by opening the auxiliary valves 1832 and 1833 and the outflow valves 1817–1821.

Now, an example of forming a light receiving layer on a cylindrical substrate 1837 as a substrate will be described. $SiH_4$/He gas from the gas cylinder 1802, $GeH_4$/He gas from the gas cylinder 1803, $NH_3$ gas from the gas cylinder 1805 are led into mass-flow controllers 1807, 1808 and 1810, respectively, by opening the valves 1822, 1823 and 1825 and controlling the pressures at outlet pressure gauges 1827, 1828 and 1830 to 1 $Kg/cm^2$ respectively and gradually opening the inflow valves 1812, 1813 and 1815, respectively. Successively, the outflow valves 1817, 1818 and 1820 and the auxiliary valve 1832 are gradually opened to lead respective gases into the reaction chamber 1801. The outflow valves 1817, 1818 and 1820 are so controlled that the flow rate ratio of the $SiH_4$/He gas, the $GeH_4$/He gas and the $NH_3$ gas may have a desired value and opening of the main valve 1834 is also adjusted while watching the vacuum indicator 1836 so that the pressure in the reaction chamber 1801 may reach a desired value. After confirming that the temperature of the substrate 1837 is set at about 50° - about 400° C. by heater 1838, power source 1840 is set at a desired power to excite glow discharge in the reaction chamber 1801, and at the same time, the flow rate of $NH_3$ gas is controlled according to a predetermined change rate curve by gradually changing the opening of the valve 1818 manually or by an outside driving motor, or by other means, thereby controlling the contents C(N) of nitrogen atoms existing in the layer thus formed. In this manner, the first layer (I) is formed on the substrate 1837.

A second layer (II) can be formed on the first layer (I) thus formed to the desired thickness by similar valve operations as used for forming the first layer (I), for example, by leading a $SiH_4$ gas, a $C_2H_4$ gas and/or a NO gas, after diluted with a dilution gas such as He, etc. if necessary, into the reaction chamber 1801 and exciting glow discharge under the desired conditions.

To contain halogen atoms in the second layer (II), the second layer (II) is formed in the same manner as above by adding a $SiF_4$ gas, a $C_2H_4$ gas and/or a NO gas or together with the $SiF_4$ gas thereto.

It is needless to say that all the outflow valves excluding those for the necessary gases for producing the respective layers are closed. Also, in order to avoid remaining of the gas used for the formation of the preceding layer in the reaction chamber 1801 and the gas pipelines from the outflow valves 1817–1821 to the reaction chamber 1801 during the formation of the respective layers, the system can be evacuated to vacuum, if necessary, by closing the outflow valves 1817–1821, opening the auxiliary valves 1832 and 1833, and fully opening the main valve 1834.

Each content of carbon atoms and/or oxygen atoms existing in the second layer (II) can be controlled as desired, for example, in the case of glow discharge, by changing the flow rate ratio of the $SiH_4$ gas and the $C_2H_4$ gas and/or the NO gas to be introduced into the reaction chamber 1801 as desired, or in the case of layer formation by sputtering, by changing the sputtering area ratio of silicon wafer to graphite wafer and/or $SiO_2$ wafer or molding a target from a mixture of silicon powder with among graphite powder in various mixing ratios The content of halogen atoms (X) existing in the second layer (II) can be controlled by controlling the flow rate of the starting gas for introduction of halogen atoms such as the $SiF_4$ gas when introduced into the reaction chamber 1801.

Also, for uniformization of the layer formation, it is desirable to rotate the substrate 1837 by means of a motor 1839 at a constant speed during the layer formation.

The present invention is described in more detail by referring to the following Examples.

EXAMPLE 1

By the use of preparation device shown in FIG. 18, samples of image forming members for electrophotograph (Sample Nos. 11-1A to 13-4A, Table 2A) were prepared on a cylindrical aluminum substrate under the condition shown in Table 1A.

Figure 19:
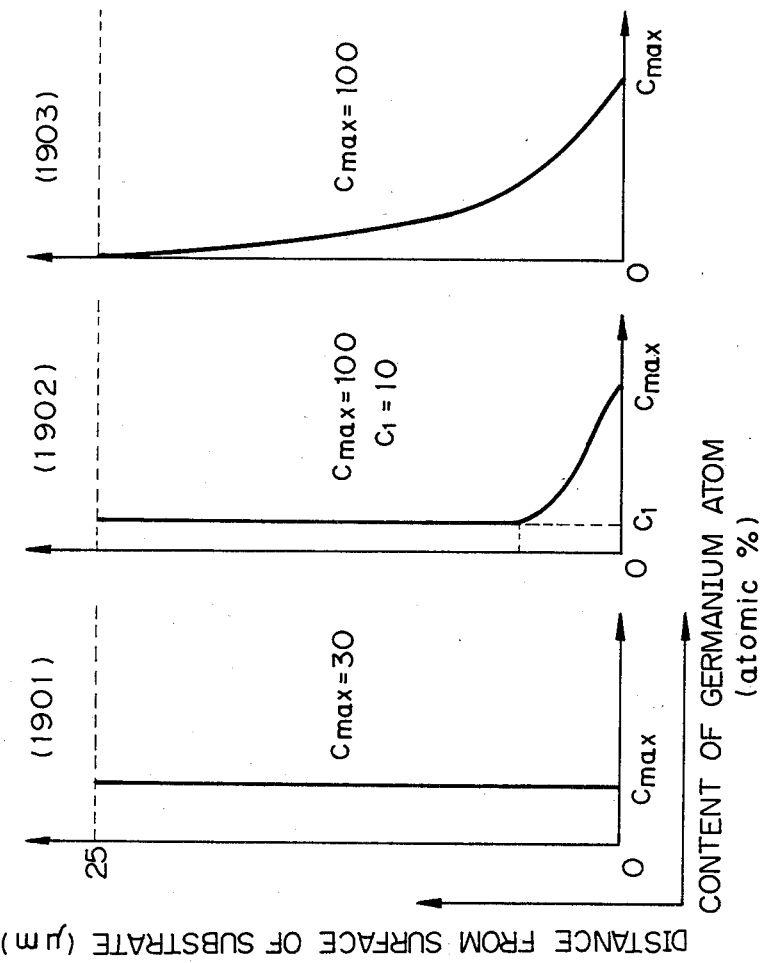
FIG. 19 shows an example of distribution concentration of germanium atoms in each of samples.
Figure 20:
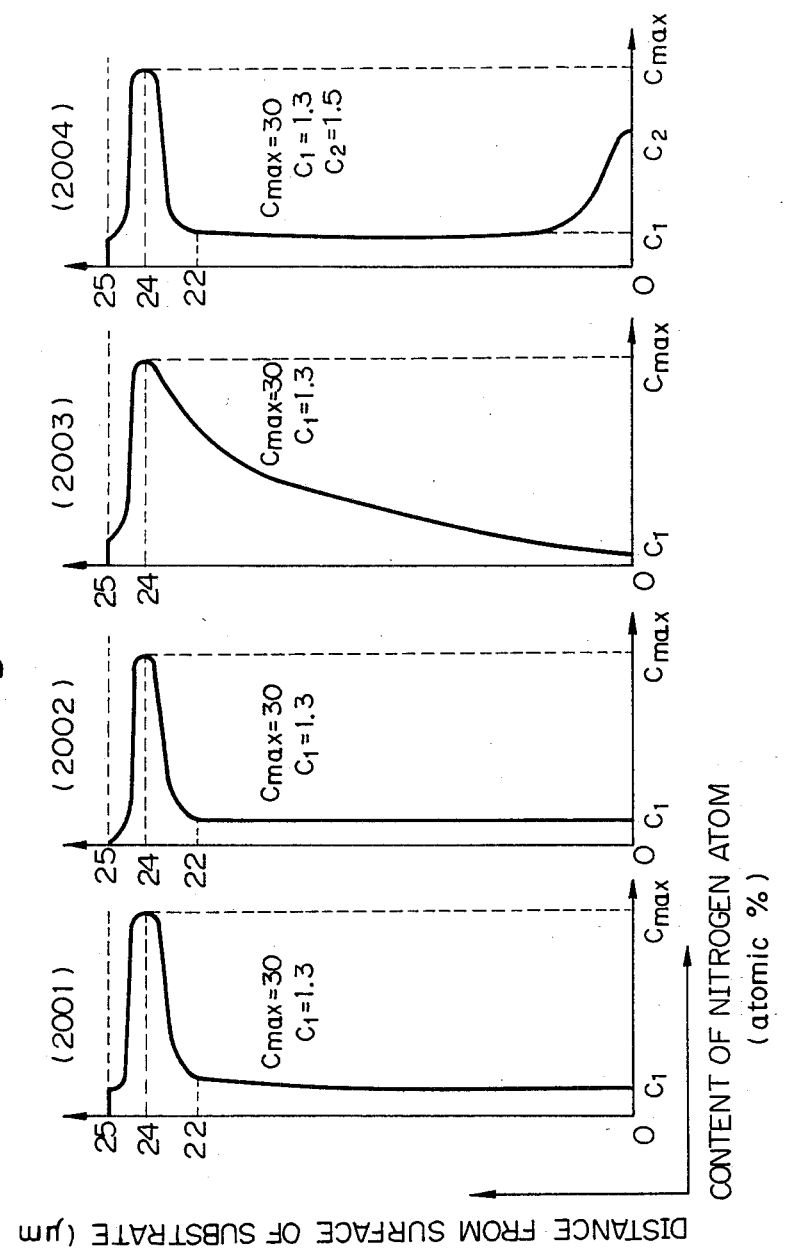
FIG. 20 shows an example of distribution concentration of nitrogen atoms in each of samples.

The concentration distributions of germanium atoms and nitrogen atoms in the sample are shown in FIG. 19, and FIG. 20, respectively.

The sample thus prepared was set on an experimental charge-exposure device, and corona charging was effected at $\oplus$ 5.0 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded on the surface of the image forming member, thus giving a good toner image thereon. The toner image was transferred onto a transfer paper by corona charging of $\oplus$ 5.0 KV, giving a clear image of high density with excellent resolution and sufficient gradation reproducibility.

The evaluation of quality of the transferred toner image was repeated in the same manner as described above except that a semi-conductor laser of GaAs type of 810 nm (10 mW) was used in place of the tungsten lamp. The sample all gave a clear image having an excellent resolution and satisfactory gradation reproducibility.

EXAMPLE 2

By the use of the preparation device shown in FIG. 18, samples of image forming members for electrophotography (Sample Nos. 21-1A to No. 23-4A, Table 4A) were prepared on a cylindrical aluminum substrate under the condition shown in Table 3A.

The concentration distributions of germanium atoms and nitrogen atoms in the sample are shown in FIG. 19, and FIG. 20, respectively.

The samples were subjected to image quality evaluation test respectively in the same manner as in Example 1. Every sample tested gave a transferred toner image of high quality, and did not show deterioration in the image quality after 200,000 times repetitive use under the operation condition of 38° C. and 80% RH.

EXAMPLE 3

By the use of preparation device shown in FIG. 18, samples of image forming members for electrophotograph (Sample Nos. 11-1B to No. 13-4B, Table 2B) were prepared on a cylindrical aluminum substrate under the condition shown in Table 1B.

The concentration distributions of germanium atoms and nitrogen atoms in the sample are shown in FIG. 19, and FIG. 20, respectively.

The sample thus prepared was set on an expermental charge-exposure device, and corona charging was effected at $\oplus$ 5.0 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by corona charging of $\oplus$ 5.0 KV, giving a clear image of high density with excellent resolution and sufficient gradation reproducibility.

The evaluation of quality of the transferred toner image was repeated in the same manner as described above except that a semi-conductor laser of GaAs type of 810 nm (10 mW) was used in place of the tungsten lamp. The sample all gave a clear image having an excellent resolution and satisfactory gradation reproducibility.

EXAMPLE 4

By the use of the preparation device shown in FIG. 18, samples of image forming members for electrophotography (Sample Nos. 21-1B to No. 23-4B, Table 4B) were prepared on a cylindrical aluminum substrate under the condition shown in Table 3B.

The concentration distributions of germanium atoms and nitrogen atoms in the sample are shown in FIG. 19, and FIG. 20, respectively.

Each sample were subjected to image quality evaluation test in the same manner as in Example 3. Every sample tested gave a transferred toner image of high quality, and did not show deterioration in the image quality after 200,000 times repetitive use under the operation condition of 38° C. and 80% RH.

EXAMPLE 5

Samples of an image forming member for electrophotography (Sample No. 11-1-1B - 11-1-8B, 12-1-1B - 12-1-8B, 13-1-1B - 13-1-8B: 24 samples) were prepared under the same conditions and in the same manner as for Sample 11-1B, 12-1B, and 13-1B in Example 3 except that the layer (II) was prepared under the conditions shown in Table 5B.

Each sample thus prepared was set separately on a copying machine and was evaluated generally for quality of transferred image and the durability of the member in continuous repetitive copying regarding each of the image forming member for electrophotography.

The evaluation of overall quality of the transferred image and the durability in continuous repetitive copying are shown in Table 6B.

EXAMPLE 6

Image forming members were prepared in the same manner as for Sample No. 11-1B in Example 3 except that the ratio of the content of silicon atoms and carbon atoms in the second layer (II) was modified by changing the target area ratio of silicon wafer to graphite in forming the second layer (II).

Each of the image forming members thus obtained was tested for the quality of the image formed after the 50,000 repetitions of image forming, developing, and cleaning processes as described in Example 3. The results are shown in Table 7B.

EXAMPLE 7

Each of the image forming members was prepared in the same manner as for the Sample No. 12-1B in Example 3 except that the content ratio of silicon atoms to carbon atoms in the second layer (II) was modified by changing the flow rate ratio of $SiH_4$ gas to $C_2H_4$ gas in forming the second layer (II).

The image forming members thus obtained were evaluated for the image quality after 50,000 repetitions of the copying process including image transfer according to the procedure described in Example 3. The results are shown in Table 8B.

EXAMPLE 8

Each of the image forming members was prepared in the same manner as for the Sample No. 13-1B in Example 3 except that the content ratio of silicon atoms to carbon atoms in the second layer (II) was modified by changing the flow rate ratio of $SiH_4$ gas, $SiF_4$ gas, and $C_2H_4$ gas on forming the second layer (II).

Each of the image forming members thus obtained was evaluated for the image quality after 50,000 repetitions of the image-forming, developing, and cleaning process according to procedure described in Example 3. The results are shown in Table 9B.

EXAMPLE 9

Each of the image forming members was prepared in the same manner as for the Sample No. 11-1B in Example 3 except that the layer thickness of the second layer (II) was changed. After the repetition of image forming, developing, and cleaning process as described in Example 3, the results shown in Table 10B were obtained.

EXAMPLE 10

By the use of preparation device shown in FIG. 18, samples of image forming members for electrophotograph (Sample Nos. 11-1C to No. 13-4C, Table 2C) were prepared on a cylindrical aluminum substrate under the condition shown in Table 1C.

The concentration distributions of germanium atoms and nitrogen atoms in the sample are shown in FIG. 19, and FIG. 20, respectively.

The sample thus prepared was set on an experimental charge-exposure device, and corona charging was effected at ⊕ 5.0 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by corona charging of ⊕ 5.0 KV, giving a clear image of high density with excellent resolution and sufficinet gradation reproducibility.

The evaluation of quality of the transferred toner image was repeated in the same manner as described above except that a semi-conductor laser of GaAs type of 810 nm (10 mW) was used in place of the tungsten lamp. The sample all gave a clear image having an excellent resolution and satisfactory gradation reproducibility.

EXAMPLE 11

By the use of the preparation device shown in FIG. 18, samples of image forming members for electrophotography (Sample Nos. 21-1C to No. 23-4C, Table 4C) were prepared on a cylindrical aluminum substrate under the condition shown in Table 3C.

The concentration distributions of germanium atoms and nitrogen atoms in the sample are shown in FIG. 19, and FIG. 20, respectively.

Each sample were subjected to image quality evaluation test in the same manner as in Example 10. Every sample tested gave a transferred toner image of high quality, and did not show deterioration in the image quality after 200,000 times repetitive use under the operation condition of 38° C. and 80% RH.

EXAMPLE 12

Samples of an image forming member for electrophotography (Sample No. 11-1-1C - 11-1-8C, 12-1-1C - 12-1-8C, 13-1-1C - 13-1-8C: 24 samples) were prepared under the same conditions and in the same manner as for Sample 11-1C, 12-1C, and 13-1C in Example 10 except that the layer (II) was prepared under the conditions shown in Table 5C.

Each sample thus prepared was set separately on a copying machine and was evaluated generally for quality of transferred image and durability of the member in continuous repetitive copying regarding to each of the image forming member for electrophotography.

The evaluation of overall quality of the transferred image and the durability in continuous repetitive copying are shown in Table 6C.

EXAMPLE 13

Image forming members were prepared in the same manner as for Sample No. 11-1C in Example 10 except that the ratio of the content of silicon atoms and oxygen atoms in the second layer (II) was modified by changing the target area ratio of silicon wafer to $SiO_2$ in forming the second layer (II).

Each of the image forming member thus obtained was tested for the quality of the image formed after the 50,000 repetitions of developing, and cleaning processes as described in Example 10. The results are shown in Table 7C.

EXAMPLE 14

Each of the image forming members was prepared in the same manner as for the Sample No. 12-1C in Example 10 excpet that the content ratio of silicon atoms to oxygen atoms in the second layer (II) was modified by changing the flow rate ratio of $SiH_4$ gas to NO gas in forming the second layer (II).

The image forming members thus obtained were evaluated for the image quality after 50,000 repetitions of the copying process including image transfer according to the procedure described in Example 10. The results are shown in Table 8C.

EXAMPLE 15

Each of the image forming members was prepared in the same manner as for the Sample No. 13-1C in Example 10 except that the content ratio of silicon atoms to oxygen atoms in the second layer (II) was modified by changing the flow rate ratio of $SiH_4$ gas, $SiF_4$ gas, and NO gas on forming the second layer (II).

Each of the image forming members thus obtained was evaluated for the image quality after 50,000 repetitions of the image-forming, developing, and cleaning process according to precedure described in Example 10. The results are shown in Table 9C.

EXAMPLE 16

Each of the image forming members was prepared in the same manner as for the Sample No. 11-1C in Example 10 except that the layer thickness of the second layer (II) was changed. After the repetition of image forming, developing, and cleaning process as described in Example 10, the results shown in Table 10C were obtained.

EXAMPLE 17

By the use of preparation device shown in FIG. 18, samples of image forming members for electrophotograph (Sample Nos. 11-1D to No. 13-4D, Table 2D) were prepared on a cylindrical aluminum substrate under the condition shown in Table 1D.

Figure 21:
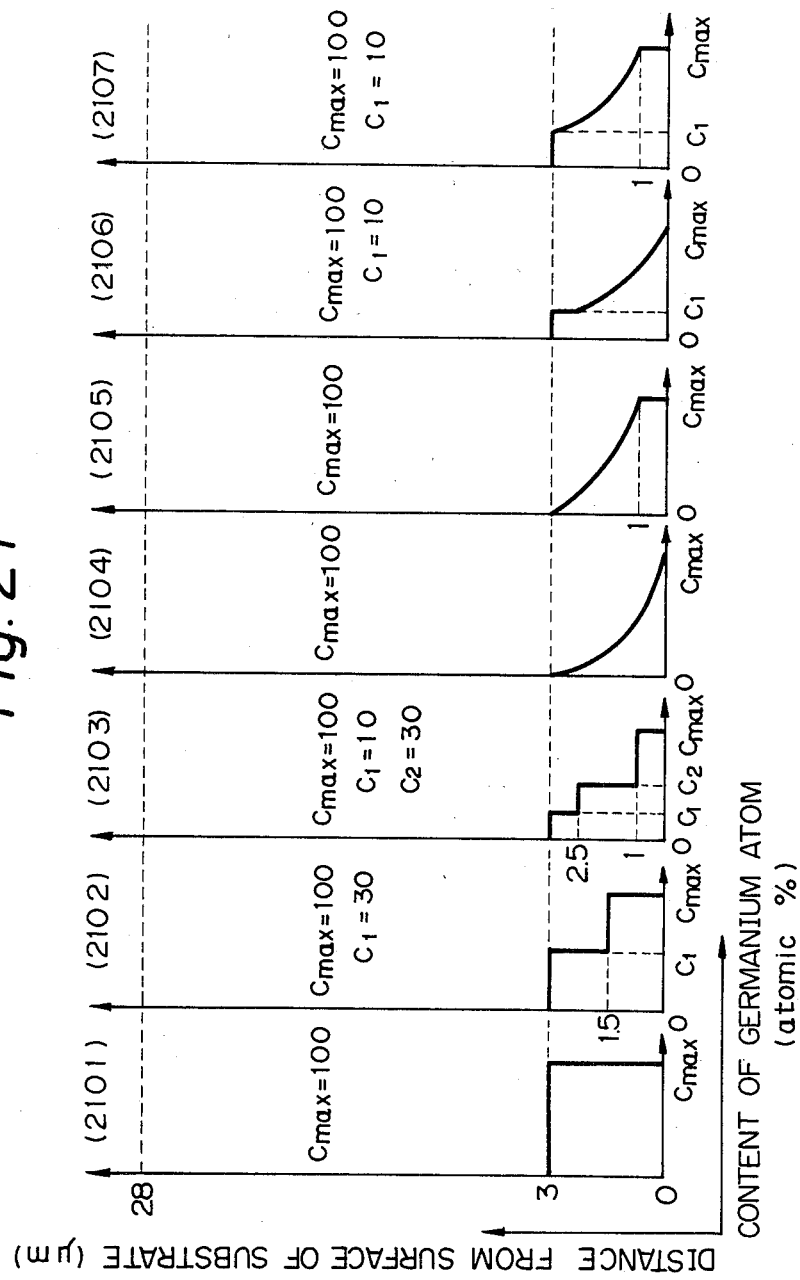
FIG. 21 shows an example of distribution concentration of germanium atoms in each of samples.
Figure 22:
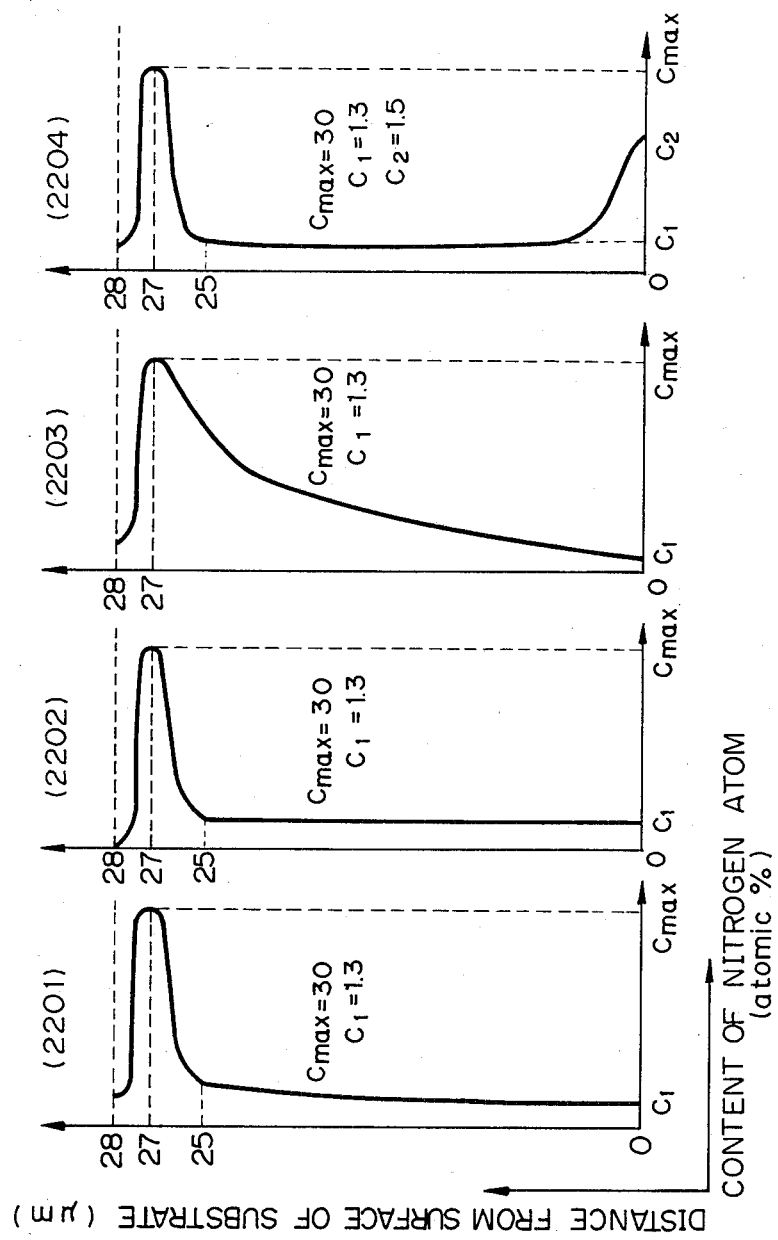
FIG. 22 shows an example of distribution concentration of nitrogen atoms in each of samples.

The concentration distributions of germanium atoms and nitrogen atoms in the sample are shown in FIG. 21, and FIG. 22, respectively.

The sample thus prepared was set on an experimental charge-exposure device, and corona charging was effected at $\oplus$ 5.0 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by corona charging of $\oplus$ 5.0 KV, giving a clear image of high density with excellent resolution and sufficient gradation reproducibility.

The evaluation of quality of the transferred toner image was repeated in the same manner as described above except that a semi-conductor laser of GaAs type of 810 nm (10 mW) was used in place of the tungsten lamp. The sample all gave a clear image having an excellent resolution and satisfactory gradation reproducibility.

EXAMPLE 18

By the use of the preparation device shown in FIG. 18, samples of image forming members for electrophotography (Sample Nos. 21-1D to 27-4D, Table 4D) were prepared on a cylindrical aluminum substrate under the condition shown in Table 3D.

The concentration distributions of germanium atoms and nitrogen atoms in the sample are shown in FIG. 21, and FIG. 22, respectively.

Each sample were subjected to image quality evaluation test in the same manner as in Example 17. Every sample tested gave a transferred toner image of high quality, and did not show deterioration in the image quality after 200,000 times repetitive use under the operation condition of 38° C. and 80% RH.

EXAMPLE 19

By the use of preparation device shown in FIG. 18, samples of image forming members for electrophotograph (Sample Nos. 11-1E to No. 13-4E, Table 2E) were prepared on a cylindrical aluminum substrate under the condition shown in Table 1E.

The concentration distributions of germanium atoms and nitrogen atoms in the sample are shown in FIG. 21, and FIG. 22, respectively.

The sample thus prepared was set on an experimental charge-exposure device, and corona charging was effected at $\oplus$ 5.0 KV for 0.3 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by corona charging of $\oplus$ 5.0 KV, giving a clear image of high density with excellent resolution and sufficient gradation reproducibility.

The evaluation of quality of the transferred toner image was repeated in the same manner as described above except that a semi-conductor laser of GaAs type of 810 nm (10 mW) was used in place of the tungsten lamp. The sample all gave a clear image having an excellent resolution and satisfactory gradation reproducibility.

EXAMPLE 20

By the use of the preparation device shown in FIG. 18, samples of image forming members for electrophotography (Sample Nos. 21-1E to No. 27-4E, Table 4E) were prepared on a cylindrical aluminum substrate under the condition shown in Table 3E.

The concentration distributions of germanium atoms and nitrogen atoms in the sample are shown in FIG. 21, and FIG. 22, respectively.

Each sample were subjected to image quality evaluation test in the same manner as in Example 19. Every sample tested gave a transferred toner image of high quality, and did not show deterioration in the image quality after 200,000 times repetitive use under the operation condition of 38° C. and 80% RH.

EXAMPLE 21

Samples of an image forming member for electrophotography (Sample No. 11-1-1E - 11-1-8E, 12-1-1E - 12-1-8E, 13-1-1E - 13-1-8E: 24 samples) were prepared under the same conditions and in the same manner as for Sample 11-1E, 12-1E, and 13-1E in Example 19 except that the layer (II) was prepared under the conditions shown in Table 5E.

Each sample thus prepared was set separately on a copying machine and was evaluated generally for quality of transferred image and durability of the member in continuous repetitive copying under the conditions described in the Examples regarding to each of the image forming member for electrophotography.

The evaluation of overall quality of the transferred image and the durability in continuous repetitive copying are shown in Table 6E.

EXAMPLE 22

Image forming members were prepared in the same manner as for Sample No. 11-1E in Example 19 except that the ratio of the content of silicon atoms and carbon atoms in the second layer (II) was modified by changing the target area ratio of silicon wafer to graphite in forming the second layer (II).

Each of the image forming members thus obtained was tested for the quality of the image formed after the 50,000 repetitions of image forming, and cleaning processes as described in Example 19. The results are shown in Table 7E.

EXAMPLE 23

Each of the image forming members was prepared in the same manner as for the Sample No. 12-1E in Example 19 except that the content ratio of silicon atoms to carbon atoms in the second layer (II) was modified by changing the flow rate ratio of SiH$_4$ gas to C$_2$H$_4$ gas in forming the second layer (II).

The image forming members thus obtained were evaluated for the image quality after 50,000 repetitions of the copying process including image transfer according to the procedure described in Example 19. The results are shown in Table 8E.

EXAMPLE 24

Each of the image forming members was prepared in the same manner as for the Sample No. 12-1E in Example 19 except that the content ratio of silicon atoms to carbon atoms in the second layer (II) was modified by changing the flow rate ratio of SiH$_4$ gas, SiF$_4$ gas, and C$_2$H$_4$ gas on forming the second layer (II).

Each of the image forming members thus obtained was evaluated for the image quality after 50,000 repetitions of the image-forming, developing, and cleaning process according to precedure described in Example 19. The results are shown in Table 9E.

EXAMPLE 25

By the use of preparation device shown in FIG. 18, samples of image forming members for electrophotograph (Sample Nos. 11-1F to No. 13-4F, Table 2F) were prepared on a cylindrical aluminum substrate under the condition shown in Table 1F.

The concentration distributions of germanium atoms and nitrogen atoms in the sample are shown in FIG. 21, and FIG. 22, respectively.

The sample thus prepared was set on an experimental charge-exposure device, and corona charging was effected at ⊕ 5.0 KV for 0.2 second, followed by immediate irradiation of a light image of a transmissive test chart with a tungsten lamp light at an irradiation dose of 2 lux-sec.

Immediately thereafter, a negatively chargeable developer (containing a toner and a carrier) was cascaded onto the surface of the image forming member, thus giving a good toner image thereon. The toner image was transferred onto a transfer paper by corona charging of ⊕ 5.0 KV, giving a clear image of high density with excellent resolution and sufficient gradation reproducibility.

The evaluation of quality of the transferred toner image was repeated in the same manner as described above except that a semi-conductor laser cf GaAs type of 810 nm (10 mW) was used in place of the tungsten lamp. The sample all gave a clear image having an excellent resolution and satisfactory gradation reproducibility.

Each of the image forming members was prepared in the same manner as for the Sample No. 11-1E in Example 19 except that the layer thickness of the second layer (II) was changed. After the repetition of image forming, developing, and cleaning process as described in Example 19, the results shown in Table 10E were obtained.

EXAMPLE 26

By the use of the preparation device shown in FIG. 18, samples of image forming members for electrophotography (Sample Nos. 21-1F to No. 27-4F, Table 4F) were prepared on a cylindrical aluminum substrate under the condition shown in Table 3F.

The concentration distributions of germanium atoms and nitrogen atoms in the sample are shown in FIG. 21, and FIG. 22, respectively.

Each samples was subjected to image quality evaluation test in the same manner as in Example 25. Every sample tested gave a transferred toner image of high quality, and did not show deterioration in the image quality after 200,000 times repetitive use under the operation condition of 38° C. and 80% RH.

EXAMPLE 27

Samples of an image forming member for electrophotography (Sample No. 11-1-1F - 11-1-8F, 12-1-1F - 12-1-8F, 13-1-1F - 13-1-8F: 24 samples) were prepared under the same conditions and in the same manner as for Sample 11-1F, 12-1F, and 13-1F in Example 25 except that the layer (II) was prepared under the conditions shown in Table 5F.

Each sample thus prepared was set separately on a copying machine and was evaluated generally for quality of transferred image and durability of the member in continuous repetitive copying under the conditions described in the Examples regarding to each of the image forming member for electrophotography.

The evaluation of overall quality of the transferred image and the durability in continuous repetitive copying are shown in Table 6F.

EXAMPLE 28

Image forming members were prepared in the same manner as for Sample No. 11-1F in Example 25 except that the ratio of the content of silicon atoms and oxygen atoms in the second layer (II) was modified by changing the target area ratio of silicon wafer to SiO$_2$ in forming the second layer (II).

Each of the image forming members thus obtained was tested for the quality of the image formed after the 50,000 repetitions of image forming, and cleaning processes as described in Example 25. The results are shown in Table 7F.

EXAMPLE 29

Each of the image forming members was prepared in the same manner as for the Sample No. 12-1F in Example 25 except that the content ratio of silicon atoms to oxygen atoms in the second layer (II) was modified by changing the flow rate ratio of SiH$_4$ gas to NO gas in forming the second layer (II).

The image forming members thus obtained were evaluated for the image quality after 50,000 repetitions of the copying process including image transfer according to the procedure described in Example 25. The results are shown in Table 8F.

EXAMPLE 30

Each of the image forming members was prepared in the same manner as for the Sample No. 13-1F in Example 25 except that the content ratio of silicon atoms to oxygen atoms in the second layer (II) was modified by changing the flow rate ratio of SiH$_4$ gas, SiF$_4$ gas, and NO gas on forming the second layer (II).

Each of the image forming members thus obtained was evaluated for the image quality after 50,000 repetitions of the image-forming, developing, and cleaning process according to procedure described in Example 25. The results are shown in Table 9F.

EXAMPLE 31

Each of the image forming members was prepared in the same manner as for the Sample No. 11-1F in Example 25 except that the layer thickness of the second layer (II) was changed. After the repetition of image forming, developing, and cleaning process as described in Example 25, the results shown in Table 10F were obtained.

The condition of the layer formation in the Examples of the present invention is as below:

Substrate temperature: approximately 200° C. for the layer containing germanium
Discharge frequency: 13.56 MHz
Inner pressure of reaction chamber during reaction: 0.3 Torr

TABLE 4A

| Depth profile of N | Sample No. | Depth profile of Ge | | |
|---|---|---|---|---|
| | | 1901 | 1902 | 1903 |
| | 2001 | 21-1A | 22-1A | 23-1A |
| | 2002 | 21-2A | 22-2A | 23-2A |
| | 2003 | 21-3A | 22-3A | 23-3A |
| | 2004 | 21-4A | 22-4A | 23-4A |

TABLE 1B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer (I) | $SiF_4/He = 0.5$ $GeF_4/He = 0.5$ $NH_3$ $H_2$ | $SiF_4 + GeF_4 = 200$ | $\dfrac{GeF_4}{(H_2 + SiF_4 + GeF_4)} = (*)$ $\dfrac{NH_3}{SiF_4 + GeF_4} = (**)$ | 0.18 | 15 | 25 |
| Second layer (II) | $SiH_4/He = 0.5$ $C_2H_4$ | $SiH_4 = 100$ | $SiH_4/C_2H_4 = 3/7$ | 0.18 | 10 | 0.5 |

(*), (**) ... Flow rate ratio was changed with regard to each sample according to the flow rate ratio change rate curve previously designed by controlling automatically the opening of the corresponding valve.

TABLE 2B

| Depth profile of N | Sample No. | Depth profile of Ge | | |
|---|---|---|---|---|
| | | 1901 | 1902 | 1903 |
| | 2001 | 11-1B | 12-1B | 13-1B |
| | 2002 | 11-2B | 12-2B | 13-2B |
| | 2003 | 11-3B | 12-3B | 13-3B |
| | 2004 | 11-4B | 12-4B | 13-4B |

TABLE 1A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Light receiving layer | $SiF_4/He = 0.5$ $GeF_4/He = 0.5$ $NH_3$ $H_2$ | $SiF_4 + GeF_4 = 200$ | $\dfrac{(SiF_4 + GeF_4)}{(H_2 + SiF_4 + GeF_4)} = 7/10$ | 0.18 | 15 | 25 |

TABLE 2A

| Depth profile of N | Sample No. | Depth profile of Ge | | |
|---|---|---|---|---|
| | | 1901 | 1902 | 1903 |
| | 2001 | 11-1A | 12-1A | 13-1A |
| | 2002 | 11-2A | 12-2A | 13-2A |
| | 2003 | 11-3A | 12-3A | 13-3A |
| | 2004 | 11-4A | 12-4A | 13-4A |

TABLE 3A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer region (I) | $SiF_4/He = 0.5$ $GeF_4/He = 0.5$ $NH_3$ $H_2$ $B_2H_6/He = 10^{-3}$ | $SiF_4 + GeF_4 = 200$ | $\dfrac{(SiF_4 + GeF_4)}{(H_2 + SiF_4 + GeF_4)} = 7/10$ $\dfrac{B_2H_6}{(SiF_4 + GeF_4)} = 2 \times 10^{-3}$ | 0.18 | 15 | 5 |
| Layer region (II) | $SiF_4/He = 0.5$ $GeF_4/He = 0.5$ $NH_3$ $H_2$ | $SiF_4 + GeF_4 = 200$ | $\dfrac{(SiF_4 + GeF_4)}{(H_2 + SiF_4 + GeF_4)} = 7/10$ | 0.18 | 15 | 20 |

TABLE 3B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer (I) | | | | | | |
| First layer | SiF$_4$/He = 0.5<br>GeF$_4$/He = 0.5<br>NH$_3$<br>H$_2$<br>B$_2$H$_6$/He = 1 × 10$^{-3}$ | SiF$_4$ + GeF$_4$ = 200 | $\frac{GeF_4}{(H_2 + SiF_4 + GeF_4)} = (*)$<br>$\frac{B_2H_6}{(SiF_4 + GeF_4)} = 2 \times 10^{-3}$ | 0.18 | 15 | 5 |
| Second layer | SiF$_4$/He = 0.5<br>GeF$_4$/He = 0.5<br>NH$_3$<br>H$_2$ | SiF$_4$ + GeF$_4$ = 200 | $\frac{GeF_4}{(H_2 + SiF_4 + GeF_4)} = (*)$ | 0.18 | 15 | 20 |
| Second layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*), (**) ... Flow rate ratio was changed with regard to each sample according to the flow rate ratio change rate curve previously designed by controlling automatically the opening of the corresponding valve.

TABLE 4B

| Depth profile of N | | Depth profile of Ge | |
|---|---|---|---|
| Sample No. | 1901 | 1902 | 1903 |
| 2001 | 21-1B | 22-1B | 23-1B |
| 2002 | 21-2B | 22-2B | 23-2B |
| 2003 | 21-3B | 22-3B | 23-3B |
| 2004 | 21-4B | 22-4B | 23-4B |

TABLE 5B

| Conditions | Gases employed | Flow rate (SCCM) | Flow rate ratio or area ratio | Discharging power (W/cm$^2$) | Layer thickness ($\mu$) |
|---|---|---|---|---|---|
| 5-1B | Ar | 200 | Si wafer:graphite = 1.5:8.5 | 0.3 | 0.5 |
| 5-2B | Ar | 200 | Si wafer:graphite = 0.5:9.5 | 0.3 | 0.3 |
| 5-3B | Ar | 200 | Si wafer:graphite = 6:4 | 0.3 | 1.0 |
| 5-4B | SiH$_4$/He = 1<br>C$_2$H$_4$ | SiH$_4$ = 15 | SiH$_4$:C$_2$H$_4$ = 0.4:9.6 | 0.18 | 0.3 |
| 5-5B | SiH$_4$/He = 0.5<br>C$_2$H$_4$ | SiH$_4$ = 100 | SiH$_4$:C$_2$H$_4$ = 5:5 | 0.18 | 1.5 |
| 5-6B | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 1.5:1.5:7 | 0.18 | 0.5 |
| 5-7B | SiH$_4$/He = 0.5<br>SiF$_4$/He = 0.5<br>C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 5-8B | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 3:3:4 | 0.18 | 1.5 |

TABLE 6B

| Second layer (II) forming conditions | Sample No./Evaluation | | |
|---|---|---|---|
| 5-1B | 11-1-1B ○ ○ | 12-1-1B ○ ○ | 13-1-1B ○ ○ |
| 5-2B | 11-1-2B ○ ○ | 12-1-2B ○ ○ | 13-1-2B ○ ○ |
| 5-3B | 11-1-3B ○ ○ | 12-1-3B ○ ○ | 13-1-3B ○ ○ |
| 5-4B | 11-1-4B ◉ ◉ | 12-1-4B ◉ ◉ | 13-1-4B ◉ ◉ |
| 5-5B | 11-1-5B ◉ ◉ | 12-1-5B ◉ ◉ | 13-1-5B ◉ ◉ |
| 5-6B | 11-1-6B ◉ ◉ | 12-1-6B ◉ ◉ | 13-1-6B ◉ ◉ |
| 5-7B | 11-1-7B ○ ○ | 12-1-7B ○ ○ | 13-1-7B ○ ○ |
| 5-8B | 11-1-8B ○ ○ | 12-1-8B ○ ○ | 13-1-8B ○ ○ |

Sample No.
Overall image quality evaluation   Durability evaluation

Evaluation standards:
◉ Excellent
○ Good

TABLE 7B

| Sample No. | 1301B | 1302B | 1303B | 1304B | 1305B | 1306B | 1307B |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊙ | ⊙ |  | Δ | x |

⊙: Very good
○: Good
Δ: Sufficiently practically usable
x: Image defect formed

TABLE 8B

| Sample No. | 1401B | 1402B | 1403B | 1404B | 1405B | 1406B | 1407B | 1408B |
|---|---|---|---|---|---|---|---|---|
| SiH$_4$:C$_2$H$_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Sufficiently practically usable
x: Image defect formed

TABLE 9B

| Sample No. | 1501B | 1502B | 1503B | 1504B | 1505B | 1506B | 1507B | 1508B |
|---|---|---|---|---|---|---|---|---|
| SiH$_4$:SiF$_4$:C$_2$H$_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Sufficiently practically usable
x: Image defect formed

TABLE 10B

| Sample No. | Thickness of second layer (II) ($\mu$) | Results |
|---|---|---|
| 1601B | 0.001 | Image defect liable to be formed |
| 1602B | 0.02 | No image defect formed up to successive copying for 20,000 times |
| 1603B | 0.05 | Stable up to successive copying for 50,000 times |
| 1604B | 1 | Stable up to successive copying for 200,000 times |

TABLE 2C

| Depth profile of N Sample No. | Depth profile of Ge | | |
|---|---|---|---|
|  | 1901 | 1902 | 1903 |
| 2001 | 11-1C | 12-1C | 13-1C |
| 2002 | 11-2C | 12-2C | 13-2C |
| 2003 | 11-3C | 12-3C | 13-3C |
| 2004 | 11-4C | 12-4C | 13-4C |

TABLE 1C

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer (I) | SiF$_4$/He = 0.5<br>GeF$_4$/He = 0.5<br>NH$_3$<br>H$_2$ | SiF$_4$ + GeF$_4$ = 200 | $\dfrac{GeF_4}{(H_2 + SiF_4 + GeF_4)} = (*)$<br><br>$\dfrac{NH_3}{SiF_4 + GeF_4} = (**)$ | 0.18 | 15 | 25 |
| Second layer (II) | SiH$_4$/He = 0.5<br>NO | SiH$_4$ = 100 | SiH$_4$/NO = 3/7 | 0.18 | 10 | 0.5 |

(*), (**)... Flow rate ratio was changed with regard to each sample according to the flow rate ratio change rate curve previously designed by controlling automatically the opening of the corresponding valve.

TABLE 3C

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer (I) region | SiF$_4$/He = 0.5<br>GeF$_4$/He = 0.5<br>NH$_3$<br>H$_2$<br>B$_2$H$_6$/He = 1 × 10$^{-3}$ | SiF$_4$ + GeF$_4$ = 200 | $\frac{GeF_4}{(H_2 + SiF_4 + GeF_4)}$ = (*)<br>$\frac{B_2H_6}{(SiF_4 + GeF_4)}$ = 2 × 10$^{-3}$ | 0.18 | 15 | 5 |
| Second layer region | SiF$_4$/He = 0.5<br>GeF$_4$/He = 0.5<br>NH$_3$<br>H$_2$ | SiF$_4$ + GeF$_4$ = 200 | $\frac{GeF_4}{(H_2 + SiF_4 + GeF_4)}$ = (*) | 0.18 | 15 | 20 |
| Second layer (II) | SiH$_4$/He = 0.5<br>NO | SiH$_4$ = 100 | SiH$_4$/NO = 3/7 | 0.18 | 10 | 0.5 |

(*) ... Flow rate ratio was changed with regard to each sample according to the flow rate ratio change rate curve previously designed by controlling automatically the opening of the corresponding valve.

TABLE 4C

| Depth profile of N | | Depth profile of Ge | | |
|---|---|---|---|---|
| | Sample No. | 1901 | 1902 | 1903 |
| | 2001 | 21-1C | 22-1C | 23-1C |
| | 2002 | 21-2C | 22-2C | 23-2C |
| | 2003 | 21-3C | 22-3C | 23-3C |
| | 2004 | 21-4C | 22-4C | 23-4C |

TABLE 5C

| Conditions | Gases employed | Flow rate (SCCM) | Flow rate ratio or area ratio | Discharging power (W/cm$^2$) | Layer thickness ($\mu$) |
|---|---|---|---|---|---|
| 5-1C | Ar | 200 | Si wafer:SiO$_2$ = 1:30 | 0.3 | 0.5 |
| 5-2C | Ar | 200 | Si wafer:SiO$_2$ = 1:60 | 0.3 | 0.3 |
| 5-3C | Ar | 200 | Si wafer:SiO$_2$ = 6:4 | 0.3 | 1.0 |
| 5-4C | SiH$_4$/He = 1<br>NO | SiH$_4$ = 15 | SiH$_4$:NO = 5:1 | 0.18 | 0.3 |
| 5-5C | SiH$_4$/He = 0.5<br>NO | SiH$_4$ = 100 | SiH$_4$:NO = 1:1 | 0.18 | 1.5 |
| 5-6C | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 5-7C | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 5-8C | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE 6C

| Second layer (II) forming conditions | Sample No./Evaluation | | |
|---|---|---|---|
| 5-1C | 11-1-1C ○ ○ | 12-1-1C ○ ○ | 13-1-1C ○ ○ |
| 5-2C | 11-1-2C ○ ○ | 12-1-2C ○ ○ | 13-1-2C ○ ○ |
| 5-3C | 11-1-3C ○ ○ | 12-1-3C ○ ○ | 13-1-3C ○ ○ |
| 5-4C | 11-1-4C ◉ ◉ | 12-1-4C ◉ ◉ | 13-1-4C ◉ ◉ |
| 5-5C | 11-1-5C ◉ ◉ | 12-1-5C ◉ ◉ | 13-1-5C ◉ ◉ |
| 5-6C | 11-1-6C ◉ ◉ | 12-1-6C ◉ ◉ | 13-1-6C ◉ ◉ |
| 5-7C | 11-1-7C ○ ○ | 12-1-7C ○ ○ | 13-1-7C ○ ○ |
| 5-8C | 11-1-8C ○ ○ | 12-1-8C ○ ○ | 13-1-8C ○ ○ |

Sample No.
Overall image quality evaluation  Durability evaluation
Evaluation standards:
◉ Excellent
○ Good

TABLE 7C

| Sample No. | 1301C | 1302C | 1303C | 1304C | 1305C | 1306C | 1307C |
|---|---|---|---|---|---|---|---|
| Si:SiO$_2$ Target (Area ratio) (NO/Ar) | 9:1 (0/1) | 6.5:3.5 (1/1) | 4:10 (1/1) | 2:60 (1/1) | 1:100 (2/1) | 1:100 (3/1) | 1:100 (4/1) |
| Si:O (Content ratio) | 9.7:0.3 | 8.8:1.2 | 7.3:2.7 | 5.0:5.0 | 4.5:5.5 | 4:6 | 3:7 |
| Image quality | ∆ | ⊙ | ⊙ | ○ | ○ | ∆ | x |

⊙: Very good
○: Good
∆: Sufficiently practically usable
x: Image defect formed

TABLE 8C

| Sample No. | 1401C | 1402C | 1403C | 1404C | 1405C | 1406C | 1407C |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evalution | ∆ | ○ | ⊙ | ⊙ | ○ | ∆ | x |

⊙: Very good
○: Good
∆: Sufficiently practically usable
x: Image defect formed

TABLE 9C

| Sample No. | 1501C | 1502C | 1503C | 1504C | 1505C | 1506C | 1507C |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | ∆ | ○ | ⊙ | ⊙ | ○ | ∆ | x |

⊙: Very good
○: Good
∆: Sufficiently practically usable
x: Image defect formed

TABLE 10C

| Sample No. | Thickness of second layer (II) (µ) | Results |
|---|---|---|
| 1601C | 0.001 | Image defect liable to be formed |
| 1602C | 0.02 | No image defect formed up to successive copying for 20,000 times |
| 1603C | 0.05 | Stable up to successive copying for 50,000 times |
| 1604C | 1 | Stable up to successive copying for 200,000 times |

TABLE 1D

| Layer constitution | Gases employed | Flow rate (SCCM) | Flow rate ratio | Discharging power (W/cm$^2$) | Layer formation rate (Å/sec) | Layer thickness (µ) |
|---|---|---|---|---|---|---|
| Layer region (I) | SiH$_4$/He = 0.5 GeH$_4$/He = 0.5 NH$_3$ | SiH$_4$ + GeH$_4$ = 200 | — | 0.18 | 15 | 3 |
| Layer region (II) | SiH$_4$/He = 0.5 NH$_3$ | SiH$_4$ = 200 | — | 0.18 | 15 | 25 |

TABLE 2D

| Depth profile of N | Sample No. | Depth profile of Ge | | | | | | |
|---|---|---|---|---|---|---|---|---|
| | | 2101 | 2102 | 2103 | 2104 | 2105 | 2106 | 2107 |
| 2201 | | 11-1D | 12-1D | 13-1D | 14-1D | 15-1D | 16-1D | 17-1D |
| 2202 | | 11-2D | 12-2D | 13-2D | 14-2D | 15-2D | 16-2D | 17-2D |
| 2203 | | 11-3D | 12-3D | 13-3D | 14-3D | 15-3D | 16-3D | 17-3D |
| 2204 | | 11-4D | 12-4D | 13-4D | 14-4D | 15-4D | 16-4D | 17-4D |

TABLE 3D

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer region (I) | SiH$_4$/He = 0.5<br>GeH$_4$/He = 0.5<br>NH$_3$<br>B$_2$H$_6$/He = 10$^{-3}$ | SiH$_4$ + GeH$_4$ = 200 | — | 0.18 | 15 | 3 |
| Layer region (II) | SiH$_4$/He = 0.5<br>NH$_3$ | SiH$_4$ = 200 | — | 0.18 | 15 | 25 |

TABLE 4D

| Depth profile of N | Sample No. | Depth of profile of Ge | | | | | | |
|---|---|---|---|---|---|---|---|---|
| | | 2101 | 2102 | 2103 | 2104 | 2105 | 2106 | 2107 |
| | 2001 | 21-1D | 22-1D | 23-1D | 24-1D | 25-1D | 26-1D | 27-1D |
| | 2002 | 21-2D | 22-2D | 23-2D | 24-2D | 25-2D | 26-2D | 27-2D |
| | 2003 | 21-3D | 22-3D | 23-3D | 24-3D | 25-3D | 26-3D | 27-3D |
| | 2004 | 21-4D | 22-4D | 23-4D | 24-4D | 25-4D | 26-4D | 27-4D |

TABLE 1E

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First layer (I) | | | | | | |
| First layer region (G) | SiH$_4$/He = 0.5<br>GeF$_4$/He = 0.5 | SiH$_4$ + GeH$_4$ = 200 | $\dfrac{GeH_4}{SiH_4 + GeH_4}$ = (*) | 0.18 | 15 | 3 |
| | NH$_3$ | | $\dfrac{NH_3}{SiH_4 + NH_3}$ = (**) | | | |
| Second layer region (S) | SiH$_4$/He = 0.5<br>NH$_3$ | SiF$_4$ = 200 | $\dfrac{NH_3}{SiH_4 + NH_3}$ = (**) | 0.18 | 15 | 25 |
| Second layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*), (**) ... Flow rate ratio was changed with regard to each sample according to the flow rate ratio change rate curve previously designed by controlling automatically the opening of the corresponding valve.

TABLE 2E

| Depth profile of N | Sample No. | Depth profile of Ge | | | | | | |
|---|---|---|---|---|---|---|---|---|
| | | 2101 | 2102 | 2103 | 2104 | 2105 | 2106 | 2107 |
| | 2201 | 11-1E | 12-1E | 13-1E | 14-1E | 15-1E | 16-1E | 17-1E |
| | 2202 | 11-2E | 12-2E | 13-2E | 14-2E | 15-2E | 16-2E | 17-2E |
| | 2203 | 11-3E | 12-3E | 13-3E | 14-3E | 15-3E | 16-3E | 17-3E |
| | 2204 | 11-4E | 12-4E | 13-4E | 14-4E | 15-4E | 16-4E | 17-4E |

TABLE 3E

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| First layer (I) | First layer region (G) | SiH$_4$/He = 0.5<br>GeH$_4$/He = 0.5<br>NH$_3$<br>B$_2$H$_6$/He = 10$^{-3}$ | SiH$_4$ + GeH$_4$ = 200 | $\dfrac{GeH_4}{SiH_4 + GeH_4}$ = (*) | 0.18 | 15 | 3 |
| | | | | $\dfrac{NH_3}{SiH_4 + NH_3}$ = (**) | | | |
| | | | | $\dfrac{B_2H_6}{SiH_4 + GeH_4}$ = 3 × 10$^{-3}$ | | | |
| | Second layer region (S) | SiH$_4$/He = 0.5<br>NH$_3$ | SiH$_4$ = 200 | $\dfrac{NH_3}{SiH_4 + NH_3}$ = (**) | 0.18 | 15 | 25 |
| Second | | SiH$_4$/He = 0.5 | SiH$_4$ = 100 | SiH$_4$/C$_2$H$_4$ = 3/7 | 0.18 | 10 | 0.5 |

TABLE 3E-continued

| Layer constitution | Gases employed | Flow rate (SCCM) | Flow rate ratio | Discharging power (W/cm$^2$) | Layer formation (Å/sec) | Layer thickness ($\mu$) |
|---|---|---|---|---|---|---|
| layer (II) | C$_2$H$_4$ | | | | | |

(*), (**)... Flow rate ratio was changed with regard to each sample according to the flow rate ratio change rate curve previously designed by controlling automatically the opening of the corresponding valve.

TABLE 4E

| Depth profile of N Sample No. | Depth profile of Ge | | | | | | |
|---|---|---|---|---|---|---|---|
| | 2101 | 2102 | 2103 | 2104 | 2105 | 2106 | 2107 |
| 2201 | 21-1E | 22-1E | 23-1E | 24-1E | 25-1E | 26-1E | 27-1E |
| 2202 | 21-2E | 22-2E | 23-2E | 24-2E | 25-2E | 26-2E | 27-2E |
| 2203 | 21-3E | 22-3E | 23-3E | 24-3E | 25-3E | 26-3E | 27-3E |
| 2204 | 21-4E | 22-4E | 23-4E | 24-4E | 25-4E | 26-4E | 27-4E |

TABLE 5E

| Conditions | Gases employed | Flow rate (SCCM) | Flow rate ratio or area ratio | Discharging power (W/cm$^2$) | Layer thickness ($\mu$) |
|---|---|---|---|---|---|
| 5-1E | Ar | 200 | Si wafer:graphite = 1.5:8.5 | 0.3 | 0.5 |
| 5-2E | Ar | 200 | Si wafer:graphite = 0.5:9.5 | 0.3 | 0.3 |
| 5-3E | Ar | 200 | Si wafer:graphite = 6:4 | 0.3 | 1.0 |
| 5-4E | SiH$_4$/He = 1 C$_2$H$_4$ | SiH$_4$ = 15 | SiH$_4$:C$_2$H$_4$ = 0.4:9.6 | 0.18 | 0.3 |
| 5-5E | SiH$_4$/He = 0.5 C$_2$H$_4$ | SiH$_4$ = 100 | SiH$_4$:C$_2$H$_4$ = 5:5 | 0.18 | 1.5 |
| 5-6E | SiH$_4$/He = 0.5 SiF$_4$/He = 0.5 C$_2$H$_4$ | SiH$_4$ + SiF$_4$ = 150 | SiH$_4$:SiF$_4$:C$_2$H$_4$ = 1.5:1.5:7 | 0.18 | 0.5 |
| 5-7E | SiH$_4$/He = 0.5 SiF$_4$/He = 0.5 C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 5-8E | SiH$_4$/He = 0.5 SiF$_4$/He = 0.5 C$_2$H$_4$ | SiH$_4$ + SiF$_4$ = 150 | SiH$_4$:SiF$_4$:C$_2$H$_4$ = 3:3:4 | 0.18 | 1.5 |

TABLE 6E

| Second layer (II) forming conditions | Sample No./Evaluation | | |
|---|---|---|---|
| 5-1E | 11-1-1E ○ ○ | 12-1-1E ○ ○ | 13-1-1E ○ ○ |
| 5-2E | 11-1-2E ○ ○ | 12-1-2E ○ ○ | 13-1-2E ○ ○ |
| 5-3E | 11-1-3E ○ ○ | 12-1-3E ○ ○ | 13-1-3E ○ ○ |
| 5-4E | 11-1-4E ◉ ◉ | 12-1-4E ◉ ◉ | 13-1-4E ◉ ◉ |
| 5-5E | 11-1-5E ◉ ◉ | 12-1-5E ◉ ◉ | 13-1-5E ◉ ◉ |
| 5-6E | 11-1-6E ◉ ◉ | 12-1-6E ◉ ◉ | 13-1-6E ◉ ◉ |
| 5-7E | 11-1-7E ○ ○ | 12-1-7E ○ ○ | 13-1-7E ○ ○ |
| 5-8E | 11-1-8E ○ ○ | 12-1-8E ○ ○ | 13-1-8E ○ ○ |

Sample No. Overall image quality evaluation  Durability evaluation
Evaluation standards:
◉ Excellent
○ Good

TABLE 7E

| Sample No. | 1301E | 1302E | 1303E | 1304E | 1305E | 1306E | 1307E |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◉ | ◉ | ○ | Δ | x |

◉: Very good
○: Good
Δ: Sufficiently practically usable
x: Image defect formed

TABLE 8E

| Sample No. | 1401E | 1402E | 1403E | 1404E | 1405E | 1406E | 1407E | 1408E |
|---|---|---|---|---|---|---|---|---|
| $SiH_4:C_2H_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Sufficiently practically usable
x: Image defect formed

TABLE 9E

| Sample No. | 1501E | 1502E | 1503E | 1504E | 1505E | 1506E | 1507E | 1508E |
|---|---|---|---|---|---|---|---|---|
| $SiH_4:SiF_4:C_2H_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ⊙ | Δ | x |

⊙: Very good
○: Good
Δ: Sufficiently practically usable
x: Image defect formed

TABLE 10E

| Sample No. | Thickness of second layer (II) (μ) | Results |
|---|---|---|
| 1601E | 0.001 | Image defect liable to be formed |
| 1602E | 0.02 | No image defect formed up to successive copying for 20,000 times |
| 1603E | 0.05 | Stable up to successive copying for 50,000 times |
| 1604E | 1 | Stable up to successive copying for 200,000 times |

TABLE 1F

| Layer constitution | | Gases employed | Flow rate (SCCM) | Flow rate ratio | Discharging power (W/cm²) | Layer formation rate (Å/sec) | Layer thickness (μ) |
|---|---|---|---|---|---|---|---|
| First layer (I) | First layer region (G) | $SiH_4/He = 0.5$ $GeH_4/He = 0.5$ $NH_3$ | $SiH_4 + GeH_4 = 200$ | $\dfrac{GeH_4}{SiH_4 + GeH_4} = (*)$  $\dfrac{NH_3}{SiH_4 + NH_3} = (**)$ | 0.18 | 15 | 3 |
| | Second layer region (S) | $SiH_4/He = 0.5$ $NH_3$ | $SiF_4 = 200$ | $\dfrac{NH_3}{SiH_4 + NH_3} = (**)$ | 0.18 | 15 | 25 |
| Second layer (II) | | $SiH_4/He = 0.5$ NO | $SiH_4 = 100$ | $SiH_4/NO = 3/7$ | 0.18 | 10 | 0.5 |

(*), (**) ... Flow rate ratio was changed with regard to each sample according to the flow rate ratio change rate curve previously designed by controlling automatically the opening of the corresponding valve.

TABLE 2F

| Depth profile of N | | Depth profile of Ge | | | | | | |
|---|---|---|---|---|---|---|---|---|
| | Sample No. | 2101 | 2102 | 2103 | 2104 | 2105 | 2106 | 2107 |
| | 2201 | 11-1F | 12-1F | 13-1F | 14-1F | 15-1F | 16-1F | 17-1F |
| | 2202 | 11-2F | 12-2F | 13-2F | 14-2F | 15-2F | 16-2F | 17-2F |
| | 2203 | 11-3F | 12-3F | 13-3F | 14-3F | 15-3F | 16-3F | 17-3F |
| | 2204 | 11-4F | 12-4F | 13-4F | 14-4F | 15-4F | 16-4F | 17-4F |

TABLE 3F

| Layer constitution | | Gases employed | Flow rate (SCCM) | Flow rate ratio | Discharging power (W/cm²) | Layer formation rate (Å/sec) | Layer thickness (μ) |
|---|---|---|---|---|---|---|---|
| First layer (I) | First layer region (G) | $SiH_4/He = 0.5$ $GeH_4/He = 0.5$ | $SiH_4 + GeH_4 = 200$ | $\dfrac{GeH_4}{SiH_4 + GeH_4} = (*)$ | 0.18 | 15 | 3 |

TABLE 3F-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| | NH$_3$<br>B$_2$H$_6$/He = 10 | | $\dfrac{NH_3}{SiH_4 + NH_3}$ = (**)<br><br>$\dfrac{B_2H_6}{SiH_4 + GeH_4}$ = 3 × 10 | | | |
| Second layer region (S) | SiH$_4$/He = 0.5<br>NH$_3$ | SiH$_4$ = 200 | $\dfrac{NH_3}{SiH_4 + NH_3}$ = (**) | 0.18 | 15 | 25 |
| Second layer (II) | SiH$_4$/He = 0.5<br>NO | SiH$_4$ = 100 | SiH$_4$/NO = 3/7 | 0.18 | 10 | 0.5 |

(*), (**) ... Flow rate ratio was changed with regard to each sample according to the flow rate ratio change rate curve previously designed by controlling automatically the opening of the corresponding valve.

TABLE 4F

| Depth profile of N | | Depth profile of Ge | | | | | | |
|---|---|---|---|---|---|---|---|---|
| | Sample No. | 2101 | 2102 | 2103 | 2104 | 2105 | 2106 | 2107 |
| 2201 | | 21-1F | 22-1F | 23-1F | 24-1F | 25-1F | 26-1F | 27-1F |
| 2202 | | 21-2F | 22-2F | 23-2F | 24-2F | 25-2F | 26-2F | 27-2F |
| 2203 | | 21-3F | 22-3F | 23-3F | 24-3F | 25-3F | 26-3F | 27-3F |
| 2204 | | 21-4F | 22-4F | 23-4F | 24-4F | 25-4F | 26-4F | 27-4F |

TABLE 5F

| Conditions | Gases employed | Flow rate (SCCM) | Flow rate ratio or area ratio | Discharging power (W/cm$^2$) | Layer thickness ($\mu$) |
|---|---|---|---|---|---|
| 5-1F | Ar | 200 | Si wafer:SiO$_2$ = 1:30 | 0.3 | 0.5 |
| 5-2F | Ar | 200 | Si wafer:SiO$_2$ = 1:60 | 0.3 | 0.3 |
| 5-3F | Ar | 200 | Si wafer:SiO$_2$ = 6:4 | 0.3 | 1.0 |
| 5-4F | SiH$_4$/He = 1<br>NO | SiH$_4$ = 15 | SiH$_4$:NO = 5:1 | 0.18 | 0.3 |
| 5-5F | SiH$_4$/He = 0.5<br>NO | SiH$_4$ = 100 | SiH$_4$:NO = 1:1 | 0.18 | 1.5 |
| 5-6F | SiH$_4$/He = 0.5<br>SiF$_4$/He = 0.5<br>NO | SiH$_4$ + SiF$_4$ = 150 | SiH$_4$:SiF$_4$:NO = 1:1:1 | 0.18 | 0.5 |
| 5-7F | SiH$_4$/He = 0.5<br>SiF$_4$/He = 0.5<br>NO | SiH$_4$ + SiF$_4$ = 15 | SiH$_4$:SiF$_4$:NO = 2:1:4 | 0.18 | 0.3 |
| 5-8F | SiH$_4$/He = 0.5<br>SiF$_4$/He = 0.5<br>NO | SiH$_4$ + SiF$_4$ = 150 | SiH$_4$:SiF$_4$:NO = 1:1:3 | 0.18 | 1.5 |

TABLE 6F

| Second layer (II) forming conditions | Sample No./Evaluation | | |
|---|---|---|---|
| 5-1F | 11-1-1F<br>◯ ◯ | 12-1-1F<br>◯ ◯ | 13-1-1F<br>◯ ◯ |
| 5-2F | 11-1-2F<br>◯ ◯ | 12-1-2F<br>◯ ◯ | 13-1-2F<br>◯ ◯ |
| 5-3F | 11-1-3F<br>◯ ◯ | 12-1-3F<br>◯ ◯ | 13-1-3F<br>◯ ◯ |
| 5-4F | 11-1-4F<br>◯ ◯ | 12-1-4F<br>◯ ◯ | 13-1-4F<br>◯ ◯ |
| 5-5F | 11-1-5F<br>◯ ◯ | 12-1-5F<br>◯ ◯ | 13-1-5F<br>◯ ◯ |
| 5-6F | 11-1-6F<br>◯ ◯ | 12-1-6F<br>◯ ◯ | 13-1-6F<br>◯ ◯ |
| 5-7F | 11-1-7F<br>◯ ◯ | 12-1-7F<br>◯ ◯ | 13-1-7F<br>◯ ◯ |
| 5-8F | 11-1-8F<br>◯ ◯ | 12-1-8F<br>◯ ◯ | 13-1-8F<br>◯ ◯ |

Sample No.
Overall image quality evaluation  Durability evaluation
Evaluation standards:
⊙ Excellent
◯ Good

TABLE 7F

| Sample No. | 1301F | 1302F | 1303F | 1304F | 1305F | 1306F | 1307F |
|---|---|---|---|---|---|---|---|
| Si:SiO$_2$ Target (Area ratio) (NO/Ar) | 9:1<br>(0/1) | 6.5:3.5<br>(1/1) | 4:10<br>(1/1) | 2:60<br>(1/1) | 1:100<br>(2/1) | 1:100<br>(3/1) | 1:100<br>(4/1) |
| Si:O | 9.7:0.3 | 8.8:1.2 | 7.3:2.7 | 5.0:5.0 | 4.5:5.5 | 4:6 | 3:7 |

TABLE 7F-continued

| Sample No. | 1301F | 1302F | 1303F | 1304F | 1305F | 1306F | 1307F |
|---|---|---|---|---|---|---|---|
| (Content ratio) Image quality evaluation | Δ | ⊚ | ⊚ | ○ | ○ | Δ | x |

⊚: Very good
○: Good
Δ: Sufficiently practically usable
x: Image defect formed

TABLE 8F

| Sample No. | 1401F | 1402F | 1403F | 1404F | 1405F | 1406F | 1407F |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evalution | Δ | ○ | ⊚ | ⊚ | ○ | Δ | x |

⊚: Very good
○: Good
Δ: Sufficiently practically usable
x: Image defect formed

TABLE 9F

| Sample No. | 1501F | 1502F | 1503F | 1504F | 1505F | 1506F | 1507F |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ○ | ⊚ | ⊚ | ○ | Δ | x |

⊚: Very good
○: Good
Δ: Sufficiently practically usable
x: Image defect formed

TABLE 10F

| Sample No. | Thickness of second layer (II) ($\mu$) | Results |
|---|---|---|
| 1601F | 0.001 | Image defect liable to be formed |
| 1602F | 0.02 | No image defect formed up to successive copying for 20,000 times |
| 1603F | 0.05 | Stable up to successive copying for 50,000 times |
| 1604F | 1 | Stable up to successive copying for 200,000 times |

1. A photoconductive member which comprises a substrate for a photoconductive member and a light receiving layer constituted of an amorphous material containing silicon atoms and germanium atoms and exhibiting photoconductivity, the light receiving layer having a layer region (N) containing nitrogen atoms ununiformly in the direction of layer thickness, the distribution concentration curve of nitrogen atoms in the direction of layer thickness being smooth, and the maximum distribution concentration being present within the light receiving layer.

2. A photoconductive member according to claim 1 in which hydrogen atoms are contained in the light receiving layer.

3. A photoconductive member according to claim 1 in which halogen atoms are contained in the light receiving layer.

4. A photoconductive member according to claim 1 in which the distribution of germanium atoms in the light receiving layer is ununiform in the direction of layer thickness.

5. A photocondutive member according to claim 1 in which the distribution of germanium atoms in the light receiving layer is uniform in the direction of layer thickness.

6. A photoconductive member according to claim 1 in which a substance (C) for controlling conductivity is contained in the light receiving layer.

7. A photoconductive member according to claim 6 in which the substance (C) for controlling conductivity is an atom belonging to Group III of Periodic Table.

8. A photoconductive member according to claim 6 in which the substance (C) for controlling conductivity is an atom belonging to Group V of Periodic Table.

9. A photoconductive member according to claim 1 in which the distribution of germanium atoms in the light receiving layer is such that germanium atoms are enriched at the substrate side.

10. A photoconductive member according to claim 4 in which the maximum value Cmax of the distribution concentration of germanium atoms in the direction of layer thickness is 1000 atomic ppm or more based on the sum of silicon atoms and germanium atoms.

11. A photoconductive member according to claim 1 in which the content of germanium atoms in the light receiving layer is 1-9.5×10$^5$ atomic ppm based on the sum of silicon atom and germanium atoms.

12. A photoconductive member according to claim 1 in which the nitrogen atoms are distributed throughout the whole layer region of the light receiving layer.

13. A photoconductive member according to claim 1 in which the nitrogen atoms are contained only in a layer region which is a part of the light receiving layer.

14. A photoconductive member according to claim 1 in which the nitrogen atoms are distributed such that the distribution concentration C(N) in the direction of layer thickness is ununiform in the layer region (N) containing the nitrogen atoms.

15. A photoconductive member according to claim 14 in which the maximum distribution concentration Cmax of distribution concentration C(N) is 67 atomic % or less based on the sum of silicon, germanium and nitrogen atoms.

16. A photoconductive member according to claim 14 in which the content of nitrogen atoms in the layer region (N) is 0.001–50 atomic % based on the sum of silicon, germanium and nitrogen atoms.

17. A photoconductive member according to claim 14 in which the upper limit of nitrogen content in the layer region (N) is 30 atomic % based on the sum of silicon, germanium and nitrogen atoms when the ratio of the layer thickness To of the layer region (N) to the layer thickness T of the light receiving layer is 2/5 or more.

18. A photoconductive member according to claim 6 in which the content of the substance (C) for controlling conductivity in the light receiving layer is $0.01–5\times 10^4$ atomic ppm.

19. A photoconductive member according to claim 2 in which the content of hydrogen atoms in the light receiving layer is 0.01–40 atomic %.

20. A photoconductive member according to claim 1 in which the layer thickness of the light receiving layer is 1–100μ.

21. A photoconductive member which comprises a substrate for a photoconductive member and a light receiving layer constituted of a first layer (I) overlying the substrate and comprising an amorphous material containing silicon atoms and germanium atoms and a second layer (II) overlying the first layer (I) and comprising an amorphous material containing silicon atoms and at least one of carbon atoms and oxygen atoms, nitrogen atoms being contained in the first layer (I), the concentration distribution curve of the nitrogen atoms in the direction of layer thickness being smooth, and the maximum distribution concentration being present within the first layer (I).

22. A photoconductive member according to claim 21 in which hydrogen atoms are contained in the light receiving layer.

23. A photoconductive member according to claim 21 in which halogen atoms are contained in the light receiving layer.

24. A photoconductive member according to claim 21 in which the germanium atoms are distributed ununiformly in the direction of layer thickness in the first layer (I).

25. A photoconductive member according to claim 21 in which the germanium atoms are distributed uniformly in the direction of layer thickness in the first layer (I).

26. A photoconductive member according to claim 21 in which a substance (C) for controlling conductivity is contained in the first layer (I).

27. A photoconductive member according to claim 26 in which the substance (C) for controlling conductivity is an atom of Group III of the Periodic Table.

28. A photoconductive member according to claim 26 in which the substance (C) for controlling conductivity is an atom of Group V of the Periodic Table.

29. A photoconductive member according to claim 21 in which the germanium atoms are distributed in the first layer (I) such that germanium atoms are enriched at the substrate side.

30. A photoconductive member according to claim 24 in which the maximum value Cmax of distribution concentration of germanium atoms in the direction of layer thickness is 1000 atomic ppm or more based on the sum of silicon atoms and germanium atoms.

31. A photoconductive member according to claim 21 in which the content of germanium atoms in the first layer (I) is $1–9.5\times 10^5$ atomic ppm based on the sum of silicon atoms and germanium atoms.

32. A photoconductive member according to claim 21 in which the nitrogen atoms are contained throughout the whole layer region of the first layer (I).

33. A photoconductive member according to claim 21 in which the nitrogen atoms are contained only in a layer region which is a part of the first layer (I).

34. A photoconductive member according to claim 21 in which the nitrogen atoms are distributed in the layer region (N) containing the nitrogen atoms such that the distribution concentration C(N) is ununiform in the direction of layer thickness.

35. A photoconductive member according to claim 34 in which the maximum distribution concentration Cmax of distribution concentration C(N) is 67 atomic % or less based on the sum of silicon, germanium and nitrogen atoms.

36. A photoconductive member according to claim 34 in which the content of nitrogen atoms in the layer region (N) is 0.001–50 atomic % based on the sum of silicon germanium and nitrogen atoms.

37. A photoconductive member according to claim 34 in which when the ratio of the layer thickness To of the layer region (N) to the layer thickness T of the light receiving layer is 2/5 or more, the upper limit of the nitrogen atoms contained in the layer region (N) is 30 atomic % based on the sum of silicon, germanium and nitrogen atoms.

38. A photoconductive member according to claim 26 in which the content of the substance (C) for controlling conductivity characteristics in the first layer (I) is $0.01–5\times 10^4$ atomic ppm.

39. A photoconductive member according to claim 22 in which the content of hydrogen atoms in the first layer (I) is 0.01–40 atomic %.

40. A photoconductive member according to claim 21 in which the first layer (I) is 1–100μ.

41. A photoconductive member according to claim 21 in which the second layer (II) contains hydrogen atoms.

42. A photoconductive member according to claim 21 in which the second layer (II) contains halogen atoms.

43. A photoconductive member according to claim 21 in which the second layer (II) is 0.03–30μ thick.

44. A photoconductive member which comprises a substrate for a photoconductive member and a light receiving layer constituted of a first layer region (G) comprising an amorphous material containing germanium atoms and a second layer region (S) comprising an amorphous material containing silicon atoms and exhibiting photoconductivity, the first layer region (G) and the second layer region (S) being provided in the mentioned order on the substrate, the light receiving layer containing nitrogen atoms and the concentration distribution curve of nitrogen atom being smooth and the maximum distribution concentration being present within the light receiving layer.

45. A photoconductive member according to claim 44 in which hydrogen atoms are contained in at least one of the first layer region (G) and the second layer region (S).

46. A photoconductive member according to claim 44 in which halogen atoms are contained in at least one of the first layer region (G) and the second layer region (S).

47. A photoconductive member according to claim 44 in which germanium atoms are ununiformly distributed in the first layer region (S).

48. A photoconductive member according to claim 44 in which germanium atoms are uniformly distributed in the first layer region (S).

49. A photoconductive member according to claim 44 in which the substance (C) for controlling conductivity is contained in the light receiving layer.

50. A photoconductive member according to claim 49 in which the substance (C) for controlling conductivity is an atom of Group III of the Periodic Table.

51. A photoconductive member according to claim 49 in which the substance (C) for controlling conductivity is an atom of Group V of the Periodic Table.

52. A photoconductive member according to claim 44 in which germanium atoms are distributed in the first layer region (G) such that germanium atoms are enriched at the substrate side.

53. A photoconductive member according to claim 47 in which the maximum value Cmax of distribution concentration of germanium atoms in the direction of layer thickness is 1000 atomic ppm or more based on the sum of silicon atoms and germanium atoms.

54. A photoconductive member according to claim 44 in which the content of germanium atoms in the first layer region (G) is $1-9.5 \times 10^5$ atomic ppm based on the sum of silicon atoms and germanium atoms.

55. A photoconductive member according to claim 44 in which the nitrogen atoms are contained throughout the whole layer region of the light receiving layer.

56. A photoconductive member according to claim 44 in which the nitrogen atoms are contained only in a layer region which is a part of the light receiving layer.

57. A photoconductive member according to claim 44 in which the nitrogen atoms are distributed in the layer region (N) containing nitrogen atoms such that the distribution content C(N) is ununiform in the direction of layer thickness.

58. A photoconductive member according to claim 57 in which the maximum distribution concentration Cmax of distribution concentration C(N) is 67 atomic % or less based on the sum of silicon, germanium, and nitrogen atoms.

59. A photoconductive member according to claim 57 in which the content of nitrogen atoms in the layer region (N) is 0.001-50 atomic % based on the sum of silicon, germanium, and nitrogen atoms.

60. A photoconductive member according to claim 57 in which the upper limit of the content of nitrogen atoms in the layer region (N) is 30 atomic % based on the sum of silicon, germanium, and nitrogen atoms when the ratio of the layer thickness To of the layer region (N) to the layer thickness T of the first layer (I) is 2/5 or more.

61. A photoconductive member according to claim 49 in which the content of the substance (C) for controlling conductivity characteristics in the light receiving layer is $0.01-5 \times 10^4$ atomic ppm.

62. A photoconductive member according to claim 45 in which the content of hydrogen atoms in the first layer region (G) is 0.01-40 atomic %.

63. A photoconductive member according to claim 44 in which the layer thickness of the light receiving layer is 1-100μ.

64. A photoconductive member which comprises a substrate for a photoconductive member, a light receiving layer constituted of a first layer (I) having a first layer region (G) overlying the substrate and comprising an amorphous material containing germanium atoms and a second layer region (S) overlying the first layer region (G), comprising an amorphous material containing silicon atoms and exhibiting photoconductivity, and a second layer (II) overlying the first layer (I) and comprising an amorphous material containing silicon atoms and at least one of carbon atoms and oxygen atoms, the first layer (I) containing nitrogen atoms, the concentration distribution curve of nitrogen atom being smooth, and the maximum distribution concentration of nitrogen atom being present within the first layer.

65. A photoconductive member according to claim 64 in which hydrogen atoms are contained in at least one of the first layer region (G) and the second layer region (S).

66. A photoconductive member according to claim 64 in which halogen atoms are contained in at least one of the first layer region (G) and the second layer region (S).

67. A photoconductive member according to claim 64 in which germanium atoms are ununiformly distributed in the first layer region (G).

68. A photoconductive member according to claim 64 in which germanium atoms are uniformly distributed in the first layer region (G).

69. A photoconductive member according to claim 64 in which a substance (C) for controlling conductivity is contained in the first layer (I).

70. A photoconductive member according to claim 69 in which the substance (C) for controlling conductivity is an atom of Group III of the Periodic Table.

71. A photoconductive member according to claim 69 in which the substance (C) for controlling conductivity is an atom of Group V of the Periodic Table.

72. A photoconductive member according to claim 67 in which germanium atoms are distributed in the first layer region (G) such that germanium atoms are enriched at the substrate side.

73. A photoconductive member according to claim 67 in which the maximum value Cmax of distribution concentration of germanium atoms in the direction of layer thickness is 1000 atomic ppm or more based on the sum of silicon atoms and germanium atoms.

74. A photoconductive member according to claim 64 in which the content of germanium atoms in the first layer region (G) is $1-9.5 \times 10^5$ atomic ppm based on the sum of silicon atoms and germanium atoms.

75. A photoconductive member according to claim 64 in which the nitrogen atoms are contained throughout the whole layer region of the first layer (I).

76. A photoconductive member according to claim 64 in which the nitrogen atoms are contained only in a layer region which is a part of the first layer (I).

77. A photoconductive member according to claim 64 in which the nitrogen atoms are distributed in the layer region (N) containing nitrogen atoms such that the distribution content C(N) is ununiform in the direction of layer thickness.

78. A photoconductive member according to claim 77 in which the maximum distribution concentration Cmax of distribution concentation C(N) is 67 atomic % or less based on the sum of silicon, germanium, and nitrogen atoms.

79. A photoconductive member according to claim 77 in which the content of nitrogen atoms in the layer region (N) is 0.001–50 atomic % based on the sum of silicon, germanium, and nitrogen atoms.

80. A photoconductive member according to claim 77 in which the upper limit of the content of nitrogen atoms in the layer region (N) is 30 atomic % based on the sum of silicon, germanium, and nitrogen atoms when the ratio of the layer thickness To of the layer region (N) to the layer thickness T of the first layer (I) is 2/5 or more.

81. A photoconductive member according to claim 69 in which the content of the substance (C) for controlling conductivity characteristics in the first layer (I) is $0.01-5 \times 10^4$ atomic ppm.

82. A photoconductive member according to claim 65 in which the content of hydrogen atoms in the first layer region (G) is 0.01–40 atomic %.

83. A photoconductive member according to claim 64 in which the layer thickness of the first layer (I) is 1–100μ.

84. A photoconductive member according to claim 64 in which the second layer (II) contains hydrogen atoms.

85. A photoconductive member according to claim 64 in which the second layer (II) contains halogen atoms.

86. A photoconductive member according to claim 64 in which the second layer (II) is 0.03–30μ thick.

87. A photoconductive member according to claim 64 in which the second layer region (S) contains 1–40 atomic % of hydrogen atoms.

88. A photoconductive member according to claim 45 in which the second layer region (S) contains 1–40 atomic % of hydrogen atoms.

89. A photoconductive member according to claim 2 in which halogen atoms are contained in the light receiving layer.

90. A photoconductive member according to claim 22 in which halogen atoms are contained in the light receiving layer.

91. A photoconductive member according to claim 45 in which halogen atoms are contained in at least one of the first layer region (G) and the second layer region (S).

92. A photoconductive member according to claim 65 in which halogen atoms are contained in at least one of the first layer region (G) and the second layer region (S).

93. An electrophotographic process which comprises:
(a) applying a charging treatment to a photoconductive member which comprises a substrate for a photoconductive member and a light receiving layer constituted of an amorphous material containing silicon atoms and germanium atoms and exhibiting photoconductivity, the light receiving layer having a layer region (N) containing nitrogen atoms nonuniformly in the direction of layer thickness, the distribution concentration curve of nitrogen atoms in the direction of layer thickness being smooth, and the maximum distribution concentration being present within the light receiving layer; and
(b) irradiating said photoconductive member with an electromagnetic wave carrying information, thereby forming an electrostatic image.

94. An electrophotographic process which comprises:
(a) applying a charging treatment to a photoconductive member which comprises a substrate for a photoconductive member and a light receiving layer constituted of a first layer (I) overlying the substrate and comprising an amorphous material containing silicon atoms and germanium atoms and a second layer (II) overlying the first layer (I) and comprising an amorphous material containing silicon atoms and at least one of carbon atoms and oxygen atoms, nitrogen atoms being contained in the first layer (I), the concentation distribution curve of the nitrogen atoms in the direction of layer thickness being smooth, and the maximum distribution concentration being present within the first layer (I); and
(b) irradiating said photoconductive member with an electromagnetic wave carrying information, thereby forming an electrostatic image.

95. An electrophotographic process which comprises:
(a) applying a charging treatment to a photoconductive member which comprises a substrate for a photoconductive member and a light receiving layer constituted of a first layer region (G) comprising an amorphous material containing germanium atoms and a second layer region (S) comprising an amorphous material containing silicon atoms and exhibiting photoconductivity, the first layer region (G) and the second layer region (S) being provided in the mentioned order on the substrate, the light receiving layer containing nitrogen atoms and the concentration distribution curve of nitrogen atom being smooth and the maximum distribution concentration being present within the light receiving layer; and
(b) irradiating said photoconductive member with an electromagnetic wave carrying information, thereby forming an electrostatic image.

96. An electrophotographic process which comprises:
(a) applying a charging treatment to a photoconductive member which comprises a substrate for a photoconductive member, a light receiving layer constituted of a first layer (I) having a first layer region (G) overlying the substrate and comprising an amorphous material containing germanium atoms and a second layer region (S) overlying the first layer region (G), comprising an amorphous material containing silicon atoms and exhibiting photoconductivity, and a second layer (II) overlying the first layer (I) and comprising an amorphous material containing silicon atoms and at least one of carbon atoms and oxygen atoms, the first layer (I) containing nitrogen atoms, the concentration distribution curve of nitrogen atom being smooth, and the maximum distribution concentration of nitrogen atom being present within the first layer; and
(b) irradiating said photoconductive member with a an electromagnetic wave carrying information, thereby forming an electrostatic image.

* * * * *

UNITED STATES PATENT AND TRADEMARK OFFICE
CERTIFICATE OF CORRECTION

PATENT NO. : 4,595,644
DATED : June 17, 1986
INVENTOR(S) : KEISHI SAITOH, ET AL.

Page 1 of 3

It is certified that error appears in the above-identified patent and that said Letters Patent is hereby corrected as shown below:

COLUMN 19

Line 42, "$CCL_4$" should read --$CCl_4$--.

COLUMN 21

Line 60, "$(H,X)_{1/y}$" should read --$(H,X)_{1-y}$--.

COLUMN 22

Line 61, "$a-Si_{al/a}$" should read --$a-Si_aO_{1-a}$--.

COLUMN 41

TABLE 7B, "3;7" should read --3:7--.

COLUMN 49

TABLE 5E, "5-6E  $SiH_4$/He=0.5" should read --5-6E  $SiH_4$/He=0.5
           $SiF_4$/He=0.5                            $SiF_4$/He=0.5
           $C_2H_4$                                  $C_2H_6$        --.

COLUMN 51

TABLE 9E, "1506E" should read --1506E--.
          0.2:0.3:9.5          0.2:0.3
             2:8                 :9.5
                                 2:8

UNITED STATES PATENT AND TRADEMARK OFFICE
CERTIFICATE OF CORRECTION

PATENT NO. : 4,595,644
DATED : June 17, 1986     Page 2 of 3
INVENTOR(S) : KEISHI SAITOH, ET AL.

It is certified that error appears in the above-identified patent and that said Letters Patent is hereby corrected as shown below:

COLUMN 53

TABLE 6F, "11-1-4F   12-1-4F   13-1-4F
          o  o       o  o      o  o
          11-1-5F   12-1-5F   13-1-5F
          o  o       o  o      o  o
          11-1-6F   12-1-6F   13-1-6F
          o  o       o  o      o  o    should read--

11-1-4F   12-1-4F   13-1-4F
          ◎ ◎       ◎ ◎       ◎ ◎
          11-1-5F   12-1-5F   13-1-5F
          ◎ ◎       ◎ ◎       ◎ ◎
          11-1-6F   12-1-6F   13-1-6F
          ◎ ◎       ◎ ◎       ◎ ◎     --.

COLUMN 56

Line 62, "atom" should read --atoms--.

COLUMN 58

Line 33, "silicon" should read --silicon,--.
Line 49, "1-100µ" should read --1-100µ thick--.
Line 68, "atom" should read --atoms--.

UNITED STATES PATENT AND TRADEMARK OFFICE
CERTIFICATE OF CORRECTION

PATENT NO. : 4,595,644

DATED : June 17, 1986

INVENTOR(S) : KEISHI SAITOH, ET AL.

It is certified that error appears in the above-identified patent and that said Letters Patent is hereby corrected as shown below:

COLUMN 62

Line 39,   "atom" should read --atoms--.
    Line 60,   "atom" should read --atoms--.
    Line 64,   "a an" should read --an--.

Signed and Sealed this

Twenty-first Day of April, 1987

Attest:

DONALD J. QUIGG

Attesting Officer            Commissioner of Patents and Trademarks